(12) United States Patent
Khazeni et al.

(10) Patent No.: US 8,053,662 B2
(45) Date of Patent: Nov. 8, 2011

(54) SOLAR ENERGY COLLECTION DEVICES

(76) Inventors: Kasra Khazeni, San Jose, CA (US);
Faraj Aalaei, Atherton, CA (US); Saeid Ghafouri, Saratoga, CA (US); Kambiz Farnaam, Danville, CA (US)

( * ) Notice: Subject to any disclaimer, the term of this patent is extended or adjusted under 35 U.S.C. 154(b) by 249 days.

(21) Appl. No.: 12/235,376

(22) Filed: Sep. 22, 2008

(65) Prior Publication Data

US 2009/0277496 A1 Nov. 12, 2009

Related U.S. Application Data

(60) Provisional application No. 61/052,117, filed on May 9, 2008, provisional application No. 61/088,967, filed on Aug. 14, 2008.

(51) Int. Cl.
*H01L 31/0232* (2006.01)
(52) U.S. Cl. .......... 136/246; 136/259; 136/244; 438/57; 438/65; 438/66
(58) Field of Classification Search .............. 136/246
See application file for complete search history.

(56) References Cited

U.S. PATENT DOCUMENTS

| | | | |
|---|---|---|---|
| 3,350,234 A * | 10/1967 | Ule ........................... | 136/246 |
| 4,147,561 A | 4/1979 | Knight | |
| 4,166,917 A | 9/1979 | Dorfeld et al. | |
| 4,589,191 A | 5/1986 | Green et al. | |
| 4,765,726 A | 8/1988 | Johnson | |
| 5,578,139 A | 11/1996 | Jones et al. | |
| 5,772,791 A * | 6/1998 | Laing ........................... | 136/246 |
| 2003/0111103 A1 | 6/2003 | Bower et al. | |
| 2004/0103938 A1* | 6/2004 | Rider ........................... | 136/259 |
| 2004/0246596 A1 | 12/2004 | Dyson et al. | |
| 2005/0081908 A1 | 4/2005 | Stewart | |
| 2005/0081909 A1 | 4/2005 | Paull | |
| 2006/0048810 A1* | 3/2006 | Laing et al. ................... | 136/246 |
| 2006/0054212 A1 | 3/2006 | Fraas et al. | |
| 2007/0074755 A1 | 4/2007 | Eberspacher et al. | |
| 2007/0095386 A1 | 5/2007 | Gibson | |
| 2007/0113883 A1 | 5/2007 | Rhee et al. | |
| 2007/0157963 A1 | 7/2007 | Metten et al. | |
| 2007/0251569 A1* | 11/2007 | Shan et al. ................... | 136/246 |
| 2007/0277869 A1* | 12/2007 | Shan et al. ................... | 136/246 |
| 2008/0053515 A1 | 3/2008 | Paull | |
| 2008/0257398 A1* | 10/2008 | Laing et al. ................... | 136/246 |
| 2010/0132763 A1* | 6/2010 | Dutta ........................... | 136/246 |

FOREIGN PATENT DOCUMENTS

WO WO 2005/050103 * 6/2005

OTHER PUBLICATIONS

Position Sensing Detector (PSD), Segmented Photodiodes (SPOT Series), downloaded from www.osioptoelectronics.com, 5 pgs., no date.

* cited by examiner

*Primary Examiner* — Jennifer K. Michener
*Assistant Examiner* — Jayne Mershon
(74) *Attorney, Agent, or Firm* — Alexander Chen, Esq.

(57) ABSTRACT

Devices and methods for collecting solar energy using photovoltaic material are disclosed.

29 Claims, 31 Drawing Sheets

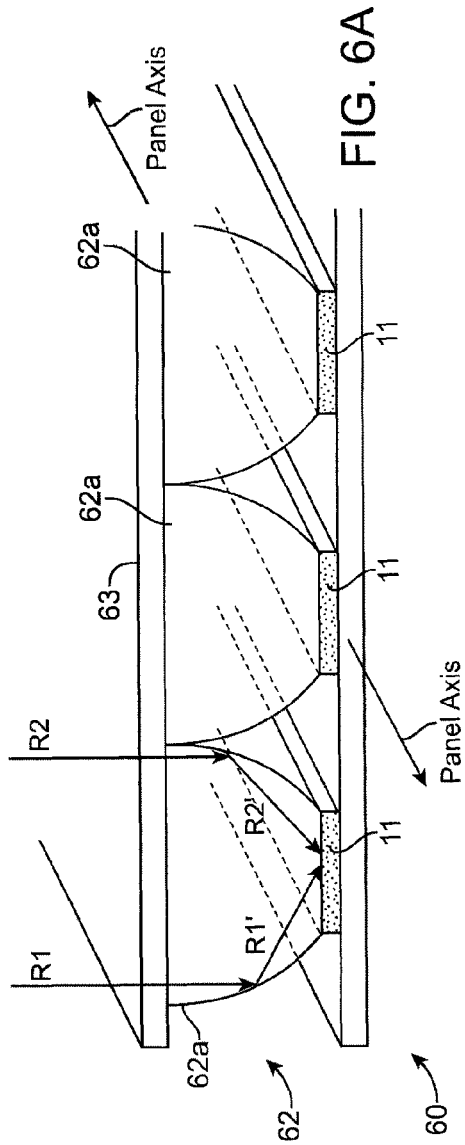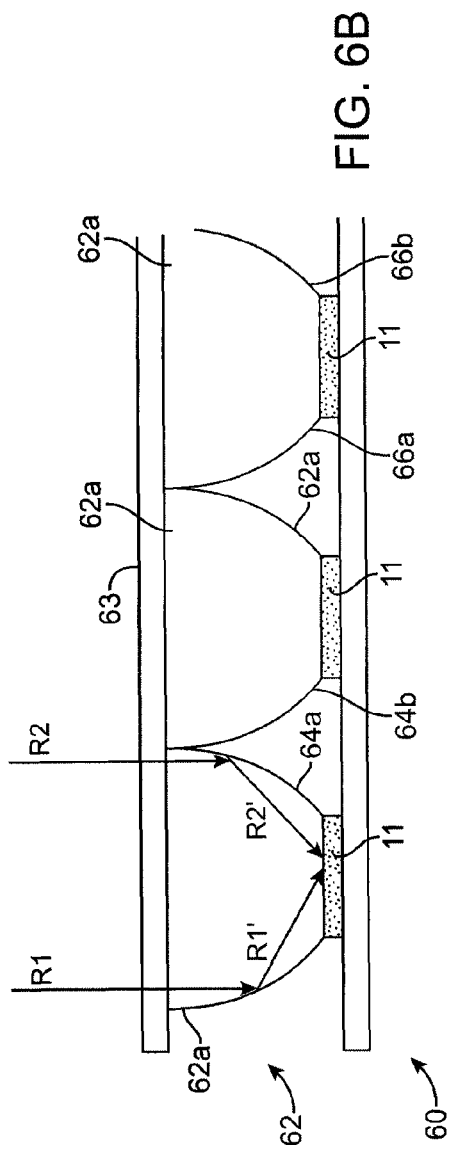

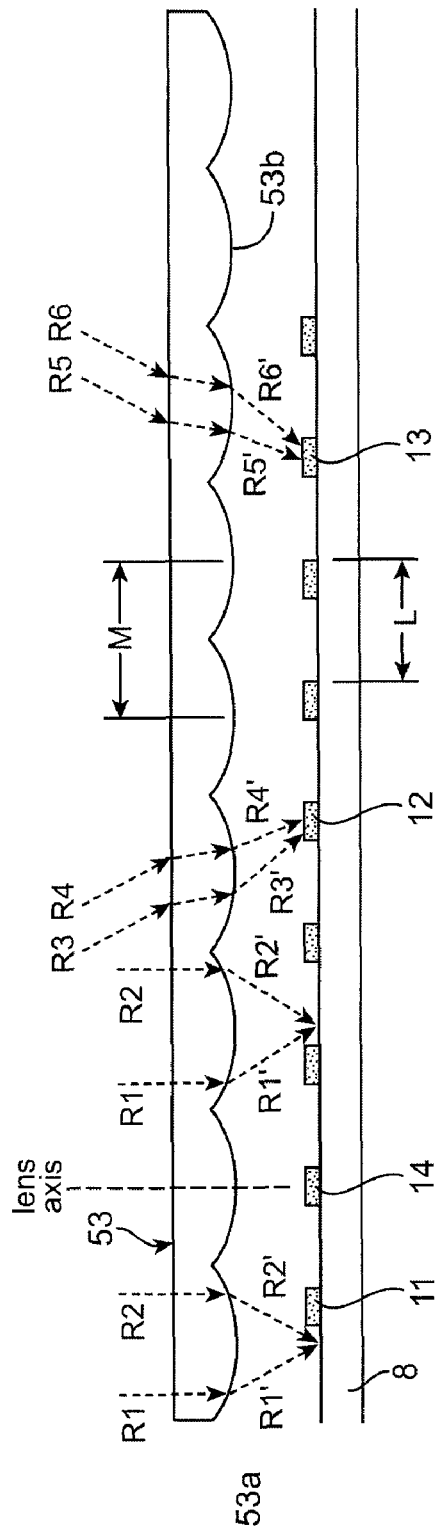
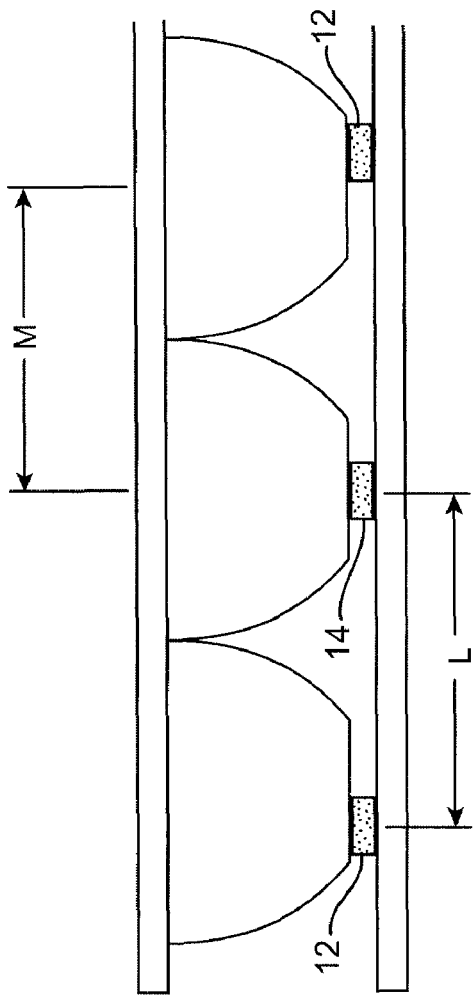
FIG. 9A
FIG. 9B

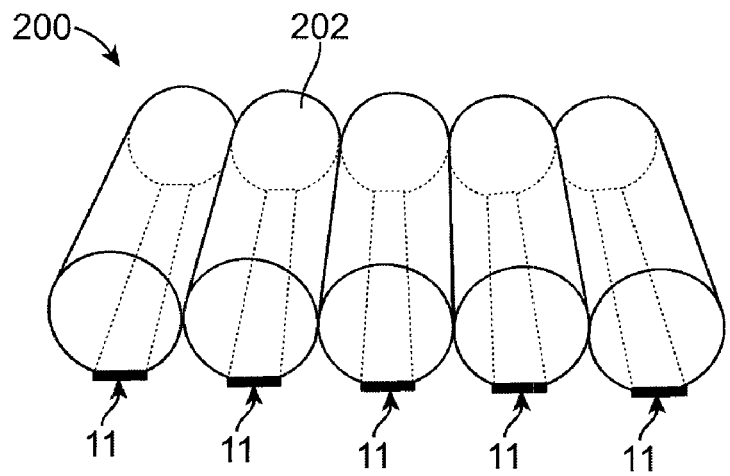
FIG. 16A
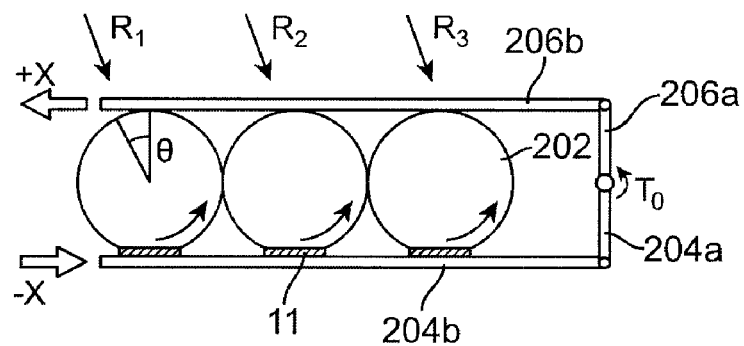
FIG. 16B
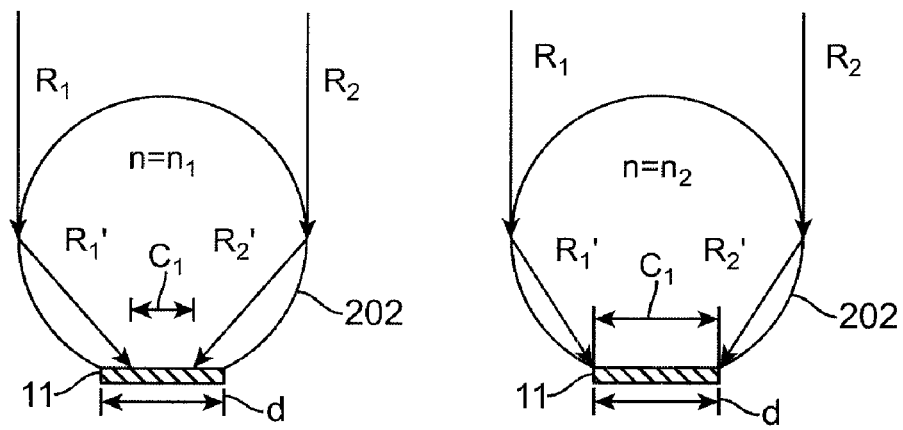
FIG. 16CFIG. 16D

SOLAR ENERGY COLLECTION DEVICES

PRIORITY STATEMENT

This application claims the benefit of U.S. Provisional Application No. 61/052,117 filed May 9, 2008 and U.S. Provisional Application No. 61/088,967 filed Aug. 14, 2008.

BACKGROUND OF THE INVENTION

1. Field of the Invention

This invention relates to devices and methods for the collection of solar energy using a photovoltaic solar cell.

2. Back ground and Description of the State of the Art

FIGS. 1A-1B illustrates a conventional construction for photovoltaic (PV) cells, e.g., a solar cell, which converts light energy to electricity. In this example, the cell 1 is generally square-like with an upper surface 2 corresponding to a sun-receiving or sun-facing side 2 of the solar cell 1. The opposing surface 3 faces away from the direction of sunlight. In this example, the solar cell 1 has an n-type doped silicon layer and p-type doped silicon layer separated by a junction layer. The sun-facing side 2 has a surface area made up of the PV material, e.g., n-type doped silicon, and contacts 5 for conducting a current when the PV material receives light energy. The contacts 5 are in the shape of lengthwise conducting lines 5a and two central buses 5b for collecting charge from the conducting lines 5a. The central buses 5b, and the corresponding electrode 5c for collecting a positive charge, are electrically connected to adjacent solar cells (preferably, a parallel connection) to form a solar cell module. Several modules connected together form a solar cell panel or solar panel.

A photovoltaic power system may have a single solar cell module or panel, or multiple modules/panels connected by combinations of series and parallel circuits as a photovoltaic array, or solar array. In the case of a single module system producing AC power output, the solar cell module may be connected to an inverter or load through a junction box that incorporates a fuse to protect the photovoltaic module if back feeding from a power utility or a battery might occur. Solar cell modules may be configured either with a frame or without a frame. A frameless solar cell module is generally referred to as a laminate. Examples of power systems having interconnected solar modules or panels may be found in U.S. Pub. No. 2003/0111103.

In recent years efforts are being made to develop thin-film PV material. Some such types of material are a-Si, CdTe, and CIGS. At present, these solutions have an efficiency rating of about 10% in commercially available panels (in laboratory conditions CIGS has been shown to be up to about 20% efficient). some of these thin-film technologies suffer from degradation and loss of efficiency over time. Presently, single crystalline PV, and to some extent poly-Si (although not as efficient), offer highest efficiency as a long-term proven technology.

Concentrated photovoltaics (CPV) utilize lenses or mirrors to focus, or concentrate solar energy onto PV material. Low concentrators, e.g., 2× concentrators, can require no tracking or movement (e.g., linear Winston collectors). These concentrators often times need to be orientated in an East-to-West orientation and tilted towards the celestial equator which may not be easily accomplished given the available mounting locations. Additionally, these concentrators can be expensive to manufacture because they use non-standard shapes for the lenses, e.g., Winston collectors. High concentrators need active moving parts in two dimensions and active cooling of the PV cells.

A "concentrator" is intended to mean a device that concentrates reflected and/or refracted light for the purposes of increasing the solar flux onto PV material. Unless otherwise noted, when a "lens" or "lenses" is/are referred to, it carries the same meaning as a concentrator, i.e., intended to focus or concentrate solar energy. A "linear", "one-dimensional" or "1-D" concentrator is intended to mean a concentrator configured for focusing light in only one-dimensions. One example of a 1-D concentrator is a rod lens. A "two-dimensional" or "2-D" concentrator is intended to focus light in two dimensions. A spherical lens is one example of a 2-D concentrator. A 1-D concentrator has a "line of focus", which is intended to mean the line or strip of focused light over the length of the concentrator. A line of focus for a 1-D concentrator, oriented east to west, changes during the course of the year. Thus, for a 1D concentrator at the Earth's equator and pointed at the celestial equator at equinox, the line of focus is parallel to the lens. At the periods of solstice the line of focus is distanced farthest from this condition. Throughout the discussion, reference may sometimes be made to a solar panel, module or solar collection system. One of ordinary skill would appreciate that the terms 'solar panel' or 'solar module' do not necessarily limit the scope of the disclosure. Unless otherwise apparent, the disclosure applies to any solar collection device that utilizes concentrators to focus light onto PV material in accordance with the foregoing objectives.

A "tracking panel" is intended to mean a panel that is maintained to face the sun such that light rays are always orientated normal to the panel surface. A tracking panel may be rotated so that solar rays are always directed normal to the surfaces having PV material. Accordingly, the effective area, $A_{EFF}$ for a tracking panel is intended to always be equal to the corresponding surface area $A_{PV}$ of the panel. For a panel that does not track the sun's motion $A_{EFF} < A_{PV}$ whenever the sun's apparent position changes from the position that the panel faces. For a fully tracked panel (as opposed to a partially tracked panel, e.g., partial tracking when rotation about only one axis as the sun changes its position in the sky) the acceptance angle is of lesser or no importance to a design because the panel is being tracked. For a partially tracked panel, e.g., when linear concentrators rotate about their longitudinal axes, the acceptance angle requirements reduce to only one dimension: the longitudinal dimension. Therefore, a linear concentrator is designed such that it provides a very large acceptance angle along its longitudinal direction so that there would be no need to move them, or the panel, in that direction.

For solar panels that use concentrators, "acceptance angle" means the angle beyond which not all focused or collected light is received on PV material. A CPV panel that does not track the sun but still collects sun light from morning to evening throughout the year (hereafter refer to as panels that increase the acceptance angle) does this in a few ways. It can be made of smaller units, such as linear Winston collectors, where the acceptance angle is designed into each collector. With such a design the CPV panel is oriented usually in an East-to-West direction and tilted towards the celestial equator. A CPV panel can also collect sunlight without tracking by incorporating moving parts within the panel, while the panel remains stationary, such as moving mirrors that focus light onto their corresponding focal points where a PV cell is positioned.

A solar panel's "collection plane" is intended to refer to the plane where the PV material is generally located to receive solar flux. For example, a two-axis tracking solar panel is configured to be rotated about two orthogonal axes that lie within the collection plane (x and y axes depicted in FIG. 8A). With reference to FIG. 7 the vector Pn extends normal to the collection plane for the panel shown.

SUMMARY OF THE INVENTION

The invention is directed to devices, methods, systems and apparatus for improving solar energy collection, reducing costs associated with manufacture of solar energy collection and improving the versatility and simplicity of solar collection devices. The methods and apparatus disclosed herein may provide a number of solutions to the high demand, but limited supply for photovoltaic ("PV") material, especially high-efficiency PV material for converting solar energy to electrical energy.

According to one aspect of the invention, a collection device includes a series of glass (or other transparent material) rods, e.g., rods with a circular cross section, that are arranged parallel and side by side to each other. Each rod acts as a linear lens having, e.g., approximately a 5 to 1 concentration ratio when standard glass is used and the PV material is attached directly to the rod lenses. The rods can have a larger or smaller concentration ratio depending on the index of refraction of the material. Tracking may or may not be used. In some embodiments, tracking may not be necessary. Instead, the collection device may be rotated about a single axis normal to the panel, thereby rotating all rods simultaneously to allow collection of solar energy. In some embodiments, a minimal movement may be achieved by rotation of each rod lens about its longitudinal axis within the panel, thereby allowing the collection of solar energy as the sun's apparent position changes. Other aspects of the disclosure which can be practiced in view of the disclosure: no requirement for active cooling of the PV cells and no requirement for installation at an angle or orientation, thereby allowing a solar collection device to be more easily deployed; the same footprint as conventional panels; a higher efficiency than a flat panel (assuming the same type of PV material is used). In some embodiments, a solar collection device may be self installed, which offers the advantage of dramatically decreasing the installation cost (up to about 50%), as will be apparent from the disclosure. In other embodiments, a panel containing the rod lenses can be tracked on a 1D tracking platform without the need for each individual rod lens to rotate. In other embodiments, the cross section of the rod lenses can be elliptical or any other shape.

According to one aspect of the disclosure, rod lenses are used to collect solar energy onto a strip of PV material. According to these embodiments, the PV material may be affixed to the rod lenses and the rod lenses rotated about their longitudinal axis (or the panel axis) to follow the sun. When the PV material is affixed to the rods, the PV material may be made separately, then affixed to the rods using, e.g., an index-matching adhesive, or formed on the rods, e.g., by chemical vapor deposition, evaporation, electroplating, or other suitable manufacturing techniques. In terms of assessing the efficiency of a collector using rod lenses according to the disclosure, it is estimated that about 7% efficiency is lost due to reflection. However, as compared to a flat panel, rod lenses made of standard glass may have an approximate 5 to 1 concentration ratio, which provides about a 10% gain in efficiency over a flat panel using the same PV material. The combined effect, i.e., loss due to reflection (due to the curved lens surface)+5 to 1 concentration ratio, means a solar collector according to the disclosure is able to achieve the same, or in some cases a higher level of efficiency but with a lower manufacturing cost and in some cases installation cost. A rod lens may have a simple shape, e.g., cylindrical, which provides costs advantages because this structure is readily available at high volumes from most glass manufacturers. A circular cross-section rod lens may be desirable when collecting solar energy by rotating each rod because the lens is rotationally symmetric. Thus, when collecting solar energy by rotating lenses about their longitudinal axes, the individual lenses can be packed together closely without interface from neighboring rods.

According to another aspect of the disclosure, PV cell strips may be separated from the rod lenses so that there is a finite distance between the lens and PV cell strips. In these embodiments, the strips can be affixed to a separate plate and the rod lenses to another plate. The two plates may then be moved with respect to each other to keep the PV cell strips in focus.

Solar collection devices of the foregoing type may be utilized for roof top power generation and commercial-scale power generation, in which case the entire panel may or may not be tracked. Solar collection devices according to the disclosure may also be constructed as "curtain" applications in high rise buildings or integrated inside windows.

The following conventions/definitions are adopted. Movement of the sun during the day and over the course of the year means the apparent east-west and north-south motion, respectively, of the sun across the sky. For convenience of description, an apparent longitudinal and latitudinal motion of the sun is adopted, and intended to mean the daily and yearly apparent motion of the sun, respectively. Thus, the longitudinal motion of the sun over a single day is intended to mean the east-to-west apparent motion of the sun over a path that corresponds to the intersection of the celestial sphere and the ecliptic plane for that day. And the latitudinal motion of the sun over the year is intended to mean the movement of this path on the celestial sphere over the course of a year. Thus, for an observer located at the earth's equator, the longitudinal apparent path of the sun over the celestial sphere at the autumn or spring equinox passes directly overhead. Over the course of the year, this apparent path changes and reaches its maxima change in position from the spring/autumn equinox at the winter/summer solstices (+/−23.5 degree latitudinal change). Thus, over the course of a year the sun has an apparent "latitudinal" motion or change in position and over the course of a day the sun has an apparent "longitudinal" motion or change in position.

In accordance with the foregoing objectives, embodiments include solar panels that increase the acceptance angle without the need to move the panel. In these embodiments, concentrators are used in various arrangements so that a solar collection system need not rely on a mechanical system for moving the panel or portions thereof as the sun's position changes. In other embodiments, a single-axis translational or rotational mechanical system may be used to increase the acceptance angle. This is accomplished by either orientating the PV material relative to a lens, or using different lens types. Other embodiments adopt a shifting method or place PV cells at different locations corresponding to the focus point of a lens throughout the year. Also disclosed are methods and devices for increasing the performance at the PV cell level, again, without an increased need for relatively scarce PV material, as the case may be; so that more electrical energy can be drawn from an existing, finite or limited number of PV cells. Also disclosed are cost-effective approaches for deploying solar collection systems. According to this aspect of the invention, a more versatile system for arranging panels is provided that takes into account different environments for mounting panels which may be less than ideal given the sun's position in the sky. The disclosure also includes descriptions of solar collection devices that may be used in connection with, e.g., tracking, partial tracking or non-tracking panels, depending on need.

According to another embodiment of the invention, a solar collecting tile includes a plurality of PV strips, a plurality of linear concentrators, each concentrator positioned to concentrate solar radiation on a respective one of the plurality of PV strips, and wherein the solar collecting tile has a perimeter that has four sides, more than four sides, or it is circular.

According to another embodiment of the invention, a solar panel kit includes a first and second solar collecting tile, wherein each tile's solar-collection area is defined by a perimeter having four sides, or having more than four sides, or having a round perimeter. Each tile includes a plurality of PV strips, a plurality of linear concentrators, each concentrator positioned to concentrate solar radiation on a respective one of the plurality of PV strips, and a connector for connecting any side of the first tile to any side of the second tile.

According to another embodiment of the invention, a method for mounting a solar panel includes the steps of placing a frame on a structure, the frame having a plurality of panel mounts, locating an optimal panel orientation based on the sun's path, and arranging one or more panels having linear concentrators in the mounts among at least three different angular positions depending on the located path of the sun.

According to another embodiment of the invention, a deployable solar panel includes a plurality of linear solar-collecting elements, each of which including a linear concentrator disposed over a PV strip such that the linear concentrator concentrates incident solar energy over a length of the PV strip, and a hinge interconnecting each of the linear solar-collecting elements to an adjacent solar-collecting element. In some embodiments, the linear concentrators are rod lenses.

According to another embodiment of the invention, a solar panel kit includes a plurality of solar energy collecting strips, each of which including a linear concentrator, a left and right hinge adapted for being engaged with other strips, and a PV strip located at the line of focus of the linear concentrator.

According to another embodiment of the invention, a method for deploying a deployable solar panel includes the steps of providing a panel in a rolled-up form, wherein the panels includes a plurality of concentrators connected by hinges and each concentrator has at least one PV cell integral to it such that the concentrator focuses reflected light onto the PV material, unrolling the panel, and then connecting the PV cells to each other to form a circuit.

According to another embodiment of the invention, a solar cell includes an upper, sun-facing side formed by a PV material and a current conducting material, and a reflector arranged over the current conducting material such that solar radiation directed towards the current conducting material is reflected towards the PV material.

According to another embodiment of the invention, a solar collection device includes a solar cell comprising a PV material and contacts for collecting current from the PV material, the contacts being disposed on a sun-facing side of the solar cell, and a substrate, disposed over the solar cell, having a plurality of notches formed thereon, wherein the substrate is arranged over the solar cell so that surfaces forming the notches will reflected light away from the contacts and towards the PV material.

According to another embodiment of the invention, a method of manufacture for a solar cell includes the steps of disposing a PV material and plurality of metallic contacts on a substrate, forming a plurality of reflectors matching the locations of at least some of the contacts, and disposing the reflectors over the at least some of the contacts.

According to another embodiment, a solar cell includes a means for concentrating light away from a current-carrying bus and towards PV material. The means may include lenses that focus reflected light onto PV material, refracted light onto PV material, or a combination of the two.

According to another embodiment, a solar cell includes conductors and PV material, and a first and second lens operatively disposed in relation to the conductors and PV material, respectively, so that light is reflected and/or refracted away from the conductors and reflected and/or refracted towards the PV material.

According to another embodiment of the invention, a static solar panel has a first spatial frequency for a plurality of PV strips or PV cells, and a second spatial frequency for concentrators configured to focus light on the cells or strips, wherein the spatial frequencies are different from each other. The focused light can be refracted light, as in a lens, and/or reflected light, as in a mirror. The cells or strips may be separated by a length L, and the concentrators, e.g., rods, may be separated by a length M, and L is not equal to M. L can be such that L<<M, or L may be slightly less than M or greater than M or L>>M. L may be the same everywhere and/or M may be the same everywhere (equal spacing), such that the spacing may be described by a spatial frequency number.

The PV cells or strips may have a spatial frequency such that an intersection of this frequency with a spatial frequency for a concentrator corresponds to a particular time of year or a particular time of day in which at least one PV cell receives focused light and at least one other PV cell does not receive focused light. Or the PV cells may have a first spatial frequency and a second spatial frequency such that an intersection of these two frequencies with a spatial frequency for a concentrator corresponds to both a particular time of year and particular time of day in which at least one PV cell receives focused light and at least one other PV cell does not receive focused light.

According to yet another embodiment of the invention, a solar collection unit includes a first and second concentrator, each having an axis of symmetry, a first PV cell arranged relative to the first concentrator such that the first PV cell captures focused light when a substantial amount of focused light is not substantially coincident with the first axis of symmetry, and a second PV cell arranged relative to a second axis of symmetry such that the second PV cell captures focused light when a substantial amount of focused light is substantially coincident with the second axis of symmetry. The focused light can be either reflected or refracted light, or both reflected and refracted light. The reflected light can be TIR light. The lens may be a parabolic lens, partially parabolic lens, a lens approximating a parabolic lens, or other suitable lens type. The PV cell or strip may be arranged at different positions on a TIR plane (or above a TIR plane) corresponding to a different time of the day or time of the year, e.g., solstice, equinox, etc.

According to another embodiment of the invention, a static solar collection system includes a first set of concentrators configured for focusing solar energy onto PV material during a day of the year and/or time of day, and a second set of concentrators configured for not focusing solar energy onto PV material during the day of the year and/or time of day. In this case, the concentrators may be 1-axis or 2-axis concentrators (e.g., rod lens or spherical lens, respectively), the panel may be static in both axes or only one of the axes, and the concentrators may focus reflected, refracted or both refracted and reflected light onto PV material. The second set of concentrators are configured to focus light onto PV material during a different time of the day and/or year.

According to another embodiment of the invention, a static solar panel includes a plurality of linear concentrators, e.g., rods, each having a line of focus dependant upon the angle of incidence of solar energy during the course of the year, a plurality of PV strips, each of which being arranged below a respective one of the concentrators, and a support layer supporting the PV strips, wherein at least a portion of the support layer is configurable among a plurality of sun focusing positions by linear displacement of the support layer.

According to another embodiment of the invention, an apparatus for collecting solar energy throughout the year and of the type having all solar energy collecting units lying within a common plane includes a first collecting unit including concentrators having a line of focus, the concentrators being aligned with PV strips cells such that the line of focus is substantially not coincident with the PV strips during a first time or year, a second collecting unit including concentrators having a line of focus, the concentrators being aligned with PV strips cells such that the line of focus is substantially coincident with the PV strips during the first time of year. The first and second collection units may be separate, modular solar panels that are releasably connectable with each other to form a solar collection unit that is configured to focus light onto PV material at different times of the year.

According to a method of configuring a solar collection unit a first panel configured to focus light onto PV material only during a first portion of the calendar year is connected together with a second solar collecting unit configured to focus light onto PV material only during a second portion of the calendar year so as to create a solar collection unit configured for focusing light onto PV material during both the first and second portions of the year. The first portion of the year may include the equinox and the second portion of the year may include the solstice.

According to another embodiment of the invention, a solar panel that increases the acceptance angle includes a first layer forming a plurality of linear concentrators, each of which having an axis of symmetry for a lens type, and a plurality of PV strips arranged in a pattern such that a first PV strip is positioned to the left of the axis of symmetry, and a second PV strip is positioned to the right of the axis of symmetry, wherein the solar panel is configured as fixed relative to the earth.

According to another embodiment, a solar collecting unit capable of increasing an acceptance angle for PV material for a non-tracking panel includes a plurality of concentrators, wherein the axes of symmetry of lenses are arranged relative to a plurality of PV strips/cells such that no more than a portion of the PV strips/cells receive focused light during any time of the year.

According to other embodiments the acceptance angle of a solar collection device may be increased in various ways. In one such embodiment a solar collection device includes a concentrator having a collection area (meaning the area of the concentrated light on the PV material) and PV material having an exposure area, wherein the collection area is less than the exposure area.

According to another embodiment, a non-tracking solar collection system includes concentrators positioned relative to PV material such that at least a portion of the light collected by the concentrators is directed at PV material, wherein the acceptance angle for the solar collection device is such that the at least a portion of the collected light directed at PV material is approximately constant as the sun's apparent position changes.

According to another embodiment of the invention, a sun position sensing element for a solar panel includes a first end, a second end having at least one photodiode disposed thereon, and means for detecting a change in the sun's apparent position.

According to another embodiment of the invention, a sun position sensing element includes a photodiode having at least one active area, an aperture configured to receive sunlight, and a circuit for detecting the intensity of solar energy incident on the active area, wherein based on the intensity of detected light a determination can be made as to whether the sun is in a first or second position.

According to another embodiment, there is a method for increasing the acceptance angle for a solar panel, the solar panel including a plurality of concentrators and corresponding PV material configured to receive focused light from the concentrators. These methods include the step of rotating each of the concentrators about their lens axes as the sun's apparent position in the sky changes.

According to other embodiments a solar collection device is translucent. When mounted to structure, the panel may be less noticeable to an observer. In one example, a panel having linear concentrators with PV material attached to the concentrators is suspended from a frame. According to these embodiments, a solar panel can blend into the structure to which it is mounted, e.g., a rooftop. In other embodiments, the panel includes include patterns, messages, and/or colors. In one example, each rod lens includes a pattern or portion of a pattern over the unused part of the lens material, i.e., the portion of the lens not focusing solar energy.

According to other embodiments a solar collection device, having a collection plane, is configured to rotate about an axis normal to the collection plane when the sun's apparent position in the sky changes. In one example, the panel includes an array of linear concentrators, such as an array of rod lenses. Each rod lens may have PV material secured to it, or located relative to the lens, so that focused light is received on the PV material as the panel is rotated to follow the sun.

INCORPORATION BY REFERENCE

All publications and patent applications mentioned in this specification are herein incorporated by reference to the same extent as if each individual publication or patent application was specifically and individually indicated to be incorporated by reference.

BRIEF DESCRIPTION OF THE DRAWINGS

FIGS. 6A-6B depict perspective and cross-sectional views of embodiments of a solar panel or module incorporating linear concentrator elements that focus reflected light onto PV material. This example shows a partial parabolic lens. However, the same concept is readily adapted for use with other lens types, including lenses that only approximate a lens type or lenses that do not correspond to a standard lens type but are nonetheless capable of focusing reflected light onto PV material.

FIGS. 9A, 9B, 10A and 10B depict embodiments of static solar collection devices that are capable of increasing the acceptance angle at the expense of increasing exposure area.

FIGS. 16A-D depict additional embodiments of a solar collection device that use linear circular cross section concentrators with the PV materials directly attached to them and are capable of rotating in unison.

FIG. 18A shows a frontal view of a concentrator suitable for the solar panel depicted in FIG. 17A, which includes one or more patterns formed on sides adjacent the PV material. A perspective view of this concentrator is depicted in FIG. 18B. FIGS. 18C, 18D depict a solar panel that includes more than one pattern. At different times of the day a different pattern becomes visible to person viewing the panel.

DETAILED DESCRIPTION OF THE INVENTION

Photovoltaic (PV) solar cell efficiency, i.e., the percentage or fraction of the sun's energy striking the surface of a PV cell that is converted into electrical energy, can range from about 5% to about 40% at present time. The supply of PV material, however, is not sufficient to meet demands at this time. This is particularly true for higher quality PV material such as crystal silicon or gallium arsenide. The disclosure provides several embodiments of solar collection devices intended to increase the amount of power that can be drawn from PV material, decrease costs of manufacture for solar panels, solar cells that can produce greater power output without increased demand on PV material, and simplify the deployment of solar cells/modules/panels or alignment of such systems to make the best use of the sun's energy.

Figure 1A:
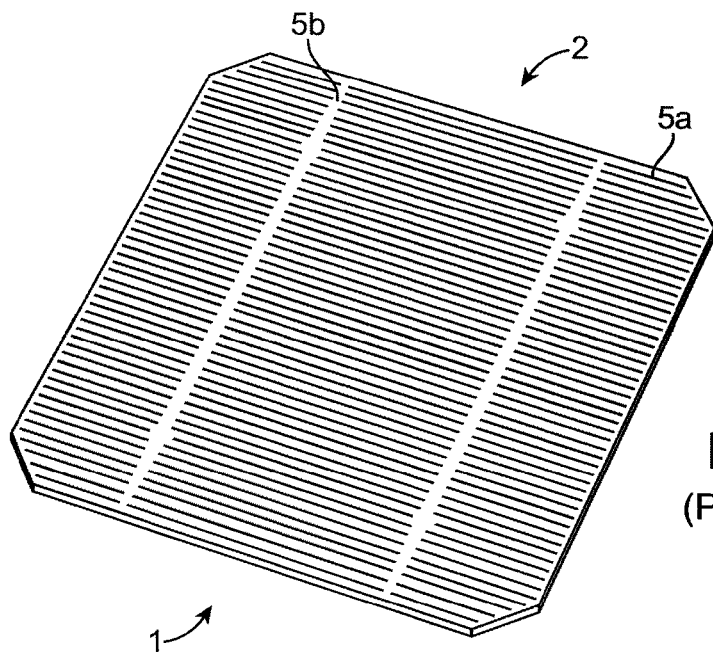
FIGS. 1A and 1B depict two perspective views of a photovoltaic (PV) cell for converting solar energy into a electrical energy
Figure 1B:
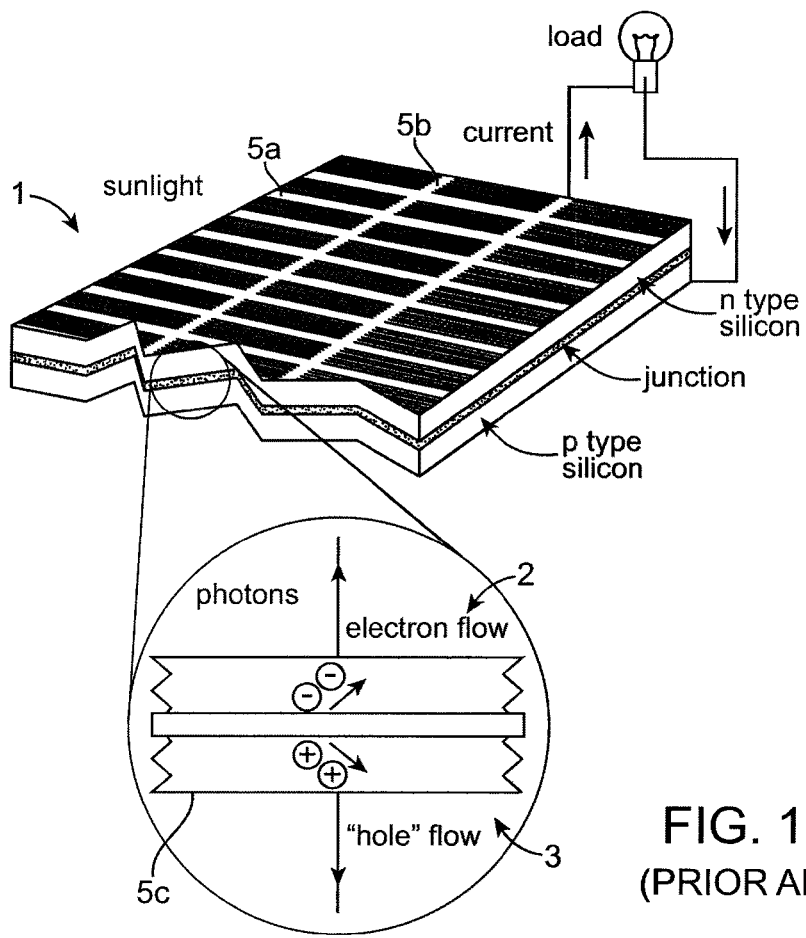
Figure 2:
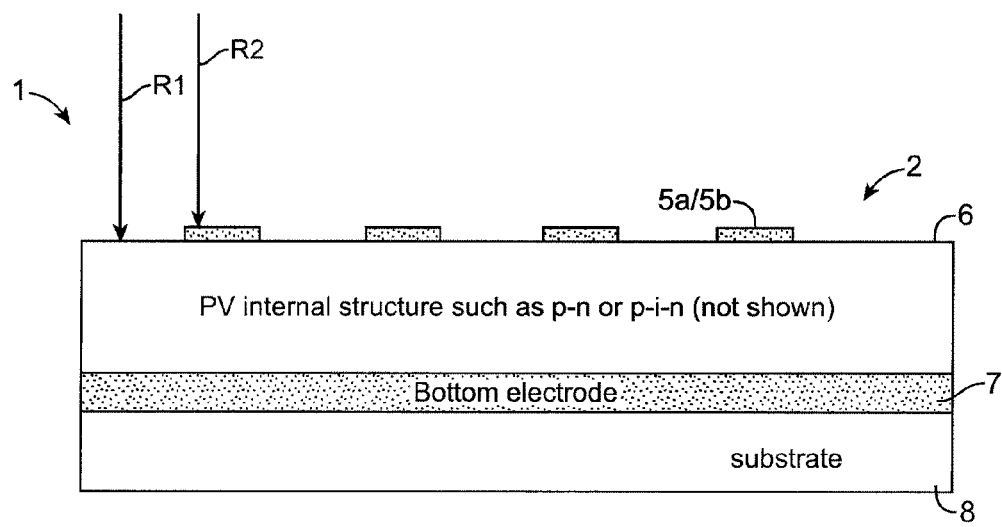
FIG. 2 depicts a cross-sectional view of a PV cell.

FIG. 2 depicts a cross-sectional view of the solar cell 1 depicted in FIGS. 1A-1B in more detail. The solar cell 1 has a sun facing side 2 formed by an upper surface of the PV material layer 6 and the contacts 5a/5b for collecting current, which are typically a metal or metal alloy. Below the PV material layer is a bottom electrode 7 for collecting the opposite charge. The PV material and upper and lower electrodes may be supported on a substrate 8. As shown, light rays R1, R2 striking the sun-facing side 2 are absorbed, scattered and/or reflected by both the PV material 6 and the conducting material, i.e., contacts 5a/5b. Any light that strikes the contacts 5a, 5b is not converted into electrical energy and therefore is wasted. Typically, the percentage of the sun-facing surface of a solar cell 1 taken by metal contacts is between 10% to 20% of the total surface area.

A. Concentrating Solar Energy onto the PV Material

It would be desirable to increase the percentage of the sun-facing side 2 occupied by the PV material 6 so that a greater percentage of the solar energy is absorbed by the PV material. However, if the width of the contacts 5a/5b, or number of contacts is reduced, then the resistance or loss in the circuit goes up. Resistance to the flow of current through contacts 5a/5b is inversely proportional to the cross-sectional area of the metal contacts and/or number of contacts over the cell. Thus, while it might seem desirable to simply remove current-conducting material, if the current pathways are too few, or reduced too much in size, then the lack of current conducting material can inhibit the flow of current.

Figure 3A:
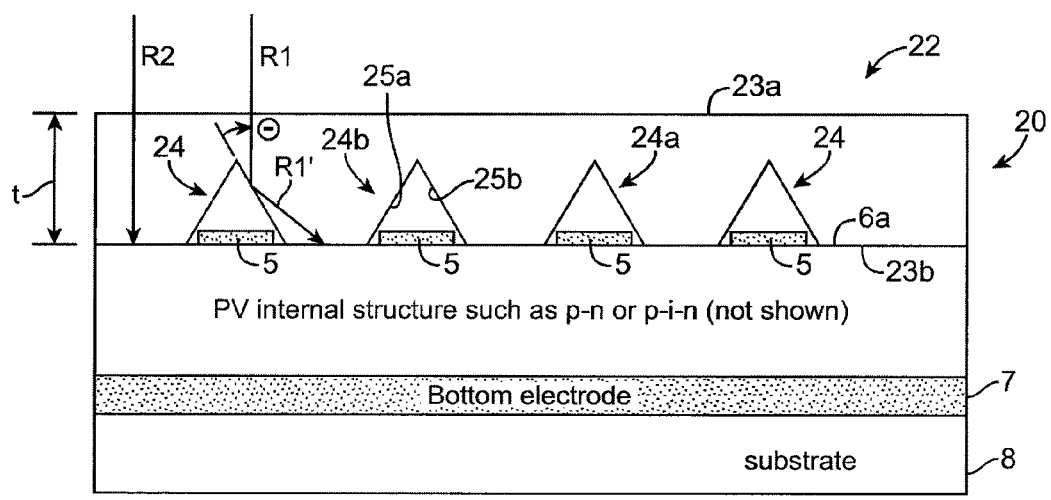
FIG. 3A depicts a cross-sectional view of PV cell having a transparent layer for reflecting solar energy towards PV material.

FIG. 3A is a cross-sectional view of one example of a solar cell 20. The cell 20 has PV material including a p-n or p-i-n structure as before, a bottom electrode 7, and a substrate 8 supporting the cell 20. In addition, the solar cell 20 has a transparent film, layer or substrate 22 (hereinafter "film 22"), which can be made from a glass, plastic or other material having a relatively low absorption coefficient. The film 22 has formed on its lower surface 23b a series of notches or grooves 24 that cause light (as depicted by ray R1) to reflect away from the contacts 5a, 5b and towards the PV material (R1'). The layer 22 has a thickness "t". In other embodiments, the film 22 may include a series of lenses centered between contacts 5, concave lens types over the contacts and/or convex lenses positioned over the PV material between contacts 5. The lenses may be arranged so that solar energy is concentrated using reflected light or refracted light. In some embodiments, the film 22 depicted in FIG. 3A may be arranged to create a condition of Total Internal Reflection ("TIR") onto the PV surface 6a (as described in greater detail, below). A light refracting concentrator may also be used in combination with a concentrator configured to create a condition of TIR.

Figure 3B:
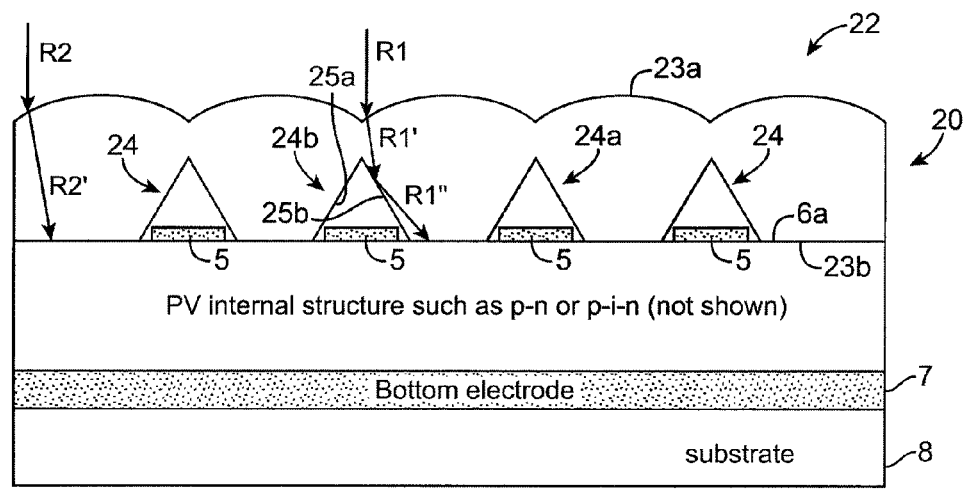
FIGS. 3B-D depict alternative embodiments of transparent layers for reflecting and/or refracting light towards PV material, including in some embodiments the use of cut-outs, grooves or surfaces intended to reflect light.

In FIG. 3B light is concentrated onto the PV material using a series of convex lens elements 23a triangular-type reflecting surfaces may be included (as shown) with the convex lenses. When these reflective surfaces (straight or curved) are included with the convex lenses, then the transparent film may be regarded as both a concentrator of reflected light and refracted light onto the PV material. As depicted, a light ray R1 is first refracted (R1') then reflected (R1") towards the PV material.

Figure 3C:
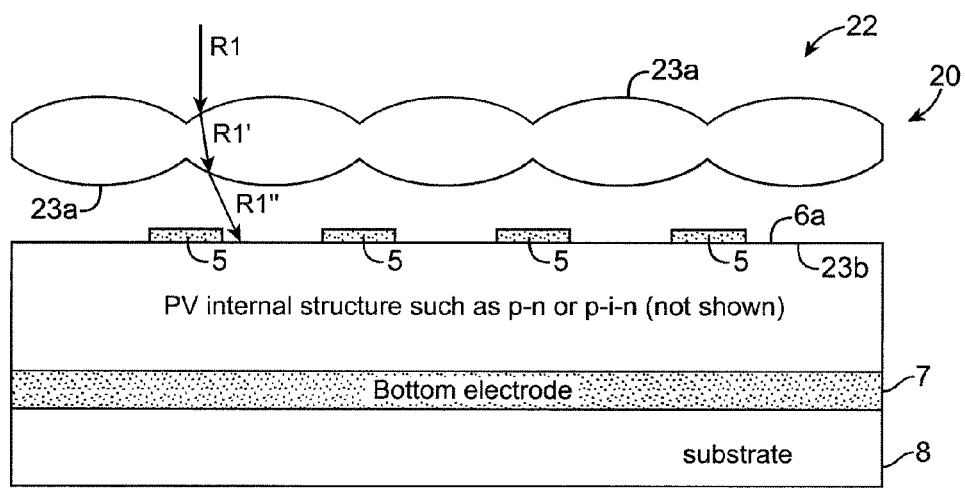

In FIG. 3C, film 22 is formed as a series of convex lens elements on opposing surfaces 23a/23b. According to these embodiments, refracted light is concentrated onto the PV material, by one convex surface 23b or two convex surfaces (as illustrated). In some embodiments, fresnel lenses or concentrators may be used instead. According to some embodiments, a reflective surface disposed over the contacts 5, e.g., triangular-type elements, is used in combination with the double convex lens.

Figure 3D:
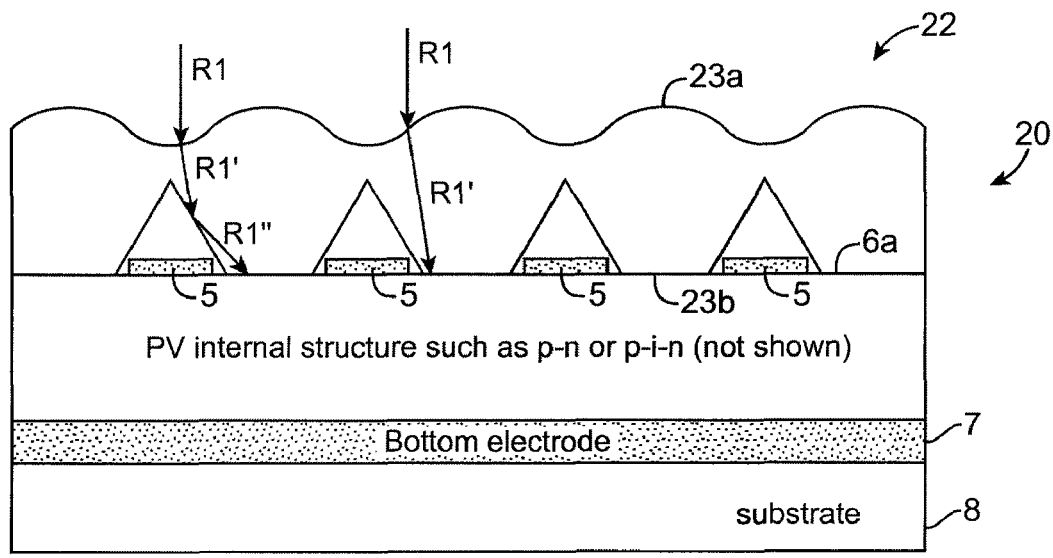

In FIG. 3D film 22 may be formed as an undulating or sinusoidal-type series of convex/concave lens elements 23a. The concave lens (placed over a contact 5) diverts light away from a contact 5 while the convex lens (placed over the PV material 6a) focuses light on the PV material. As depicted, triangular light-reflecting may also be formed so that a combination of reflected and refracted light is focused onto PV material (as before). In other embodiments, there is only the undulating or convex-concave-convex type surface. In other embodiments, two surfaces may have this pattern of convex-concave surface (i.e., same as FIG. 3C except convex-concave-convex type upper and lower surfaces).

In some embodiments the lens element disposed over the PV material, the contacts, or both may be a one-dimensional (1-D) concentrator, e.g., a cylindrical lens element, or a two-dimensional (2-D) concentrator, e.g., spherical lens element. The choice for the concentrator may also depend on the current conducting bus architecture.

The embodiment depicted in FIG. 3A will now be described in greater detail. It will be understood that certain aspects of the following discussion also apply to the above aforementioned embodiments and thus further clarification is not necessary. The film lower surface 23b may be bonded to the PV material using an index-matching glue. The grooves 24, preferably V-shaped, align over the contacts 5a/5b as shown. The grooves 24 may have a constant cross-section in the direction normal to the FIG. 3A cross-section, and extend lengthwise over the film 22 so that the contacts 5a/5b are enclosed within the grooves 24 over their entire length. Referring to groove 24b, for example, preferably the sides 25a, 25b forming this groove are straight and diverge from each other as they extend towards surface 23b. The space formed by the sides 25b, 25a and the PV material surface 6a (excluding the contacts 5a/5b) may be described by a triangle over the length of the contact 5a/5b. The grooves 24 may be formed by surfaces that are straight or curved. The grooves may be identical to each-other or they may differ from contact to contact. Some or all of the contacts may be placed within grooves.

The width at the base of the triangle depicted in FIG. 3A is about the width of the contact 5a/5b. The height of the groove 24b (i.e., distance from the base to apex of the triangle) may be chosen to create TIR such that substantially all of the light ray R1 reflects when it reaches the sloped surfaces, i.e., R1'. That is, there is no refraction, only reflection when light ray R1 reaches surface 25a or 25b. The depth and width of the groove 24 sufficient to provide TIR without shielding light from PV material may be computed from the width of the contacts 5a, 5b. Further, as made apparent from the above description, the film 22 may use these triangular-type reflective elements (or parabolic type lenses) in combination with convex, concave or a combination of the two (see e.g., FIGS. 3B-3D).

In some embodiments, one or more grooves 24 may be coated with a reflective material, such as by applying reflective paint to the grooves 24 or by a deposition process. Depositing or applying a reflective material may be desirable to account for situations when the cell 20 is not faced directly towards the sun. In some embodiments, the top surface 23a may be formed with linear convex surfaces, e.g., as depicted by convex surface 23c, which can focus light more towards the PV material between the contacts 5a,5b.

Thus, according to this embodiment there can be an increase in solar flux striking the PV material as a result of both R1' and R2 (i.e., direct and reflected light) striking the PV material. An additional advantage of this arrangement is that the resistance in the circuit formed by contacts 5a may be decreased because there is less radiation heating of the contacts 5. Since the surfaces 25a, 25b reflect some, if not all light directed towards contacts 5 the temperature of the contacts 5 may be reduced which can reduce the resistance to current flow in the metallic material. In some embodiments, however, this difference may be negligible since most heating tends to occur from conduction, not radiation.

Figure 4:
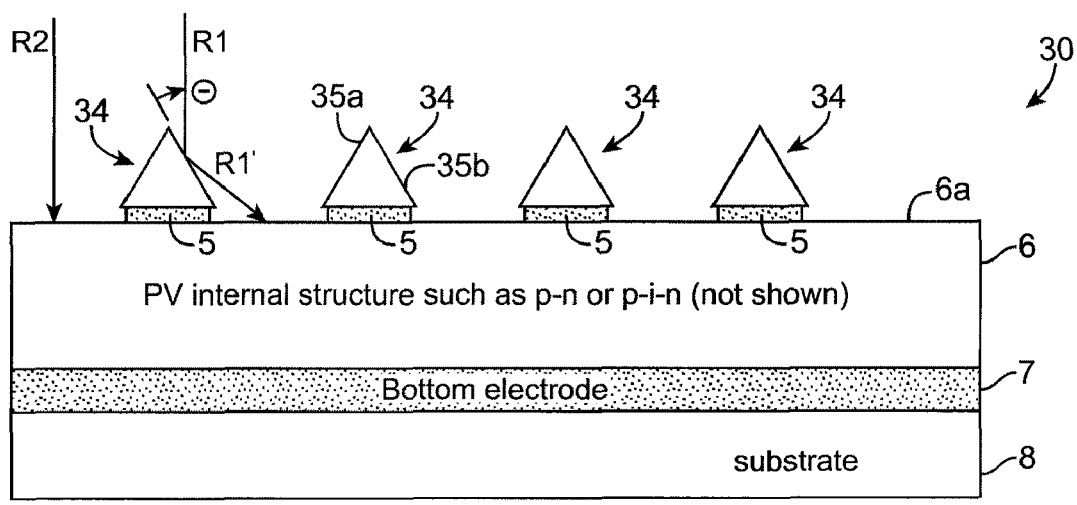
FIG. 4 depicts a cross-sectional view of PV cell having reflecting strips positioned over electrical contacts.

Referring to FIG. 4, in alternative embodiments a solar cell 30 has reflecting strips 34 disposed over the contacts 5. The strips 34 may be bonded to, soldered to, or deposited on the contacts 5. The sides 35a, 35b of the triangular-like strip reflect light ray R1 towards the PV material. Thus, according to this embodiment there is also an increase in solar flux striking the PV material as a result of both R1' and R2 (i.e., direct and reflected light) striking the PV material. Importantly, the increase need not come at the expense of removing conducting material from the surface 6. The strips may be formed over the contacts by masking techniques. They may be formed over pre-made PV cells having contacts or formed integral with the contacts, e.g., forming upper surfaces that are pointed (e.g., triangular in cross-section, straight over the length).

In some embodiments strips (FIG. 4), films or lenses (FIG. 3) may be manufactured with relatively high optical tolerances. In other embodiments, a relatively low cost and imprecise surface topology may yield significant, desirable, and/or sufficient increases in solar flux directed to the PV material. For example, as depicted in FIG. 3 triangular grooves are formed in a transparent sheet of material that is then placed over the contacts 5, as opposed to forming, e.g., parabolic lenses in the film 22. The slopes 25b may therefore be straight (as shown), or more precisely curved depending on the particular application.

In some embodiments a groove or triangular strip may be formed over one or both current collecting 5a and bus 5b contacts (see e.g., FIG. 1A). With respect to the triangular strips 34 embodiments, the bus contact 5b, or both the bus and current collecting contacts 5a, 5b may be formed to have a triangular upper surface. In these cases, there may be benefits in reduced resistance in the circuit (since resistance is inversely proportional to cross-sectional area) without the possible concern of whether PV material becomes shielded from light energy by the raised surfaces of the contacts.

It will be appreciated that one or more of solar cells 20 and 30 may be incorporated into the following embodiments of a solar module or panel, which are additional aspects of this disclosure. For example, the principles set forth above may be incorporated into a preferred embodiment that uses rod lenses, as discussed in connection with FIGS. 17, 19 and 22-24. The foregoing embodiments and the following additional embodiments therefore should be understood as not mutually exclusive of each other. Rather, one of ordinary skill will appreciate how the embodiments may be combined based on the teaching of Applicants' disclosure, and selected based on particular power needs, environments, available space, resources, budgets, etc. in view of this disclosure.

Figure 5A:
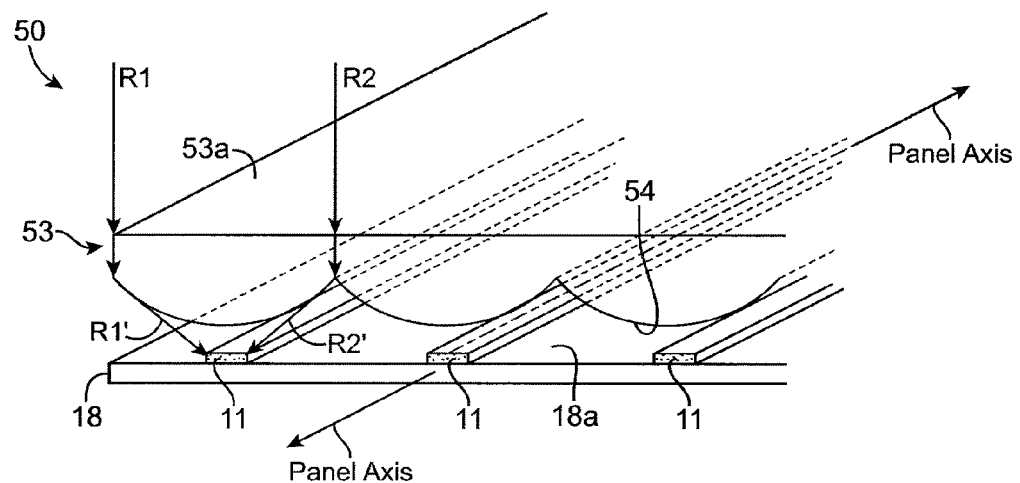
FIGS. 5A-5B depict perspective and cross-sectional views of embodiments of a solar panel or module incorporating linear concentrator elements that focus refracted light onto PV material.
Figure 5B:
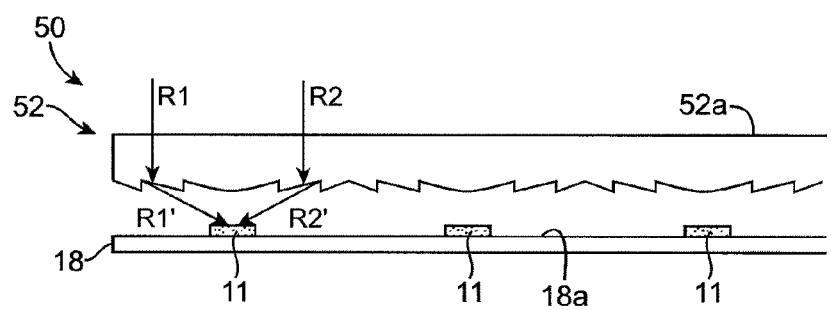

FIGS. 5A and 5B depict a partial perspective view of one embodiment, and a partial cross-sectional view of another embodiment of a solar panel 50. Solar panel 50 may be configured to increase an acceptance angle along the off-axis (e.g., perpendicular to the panel axis). The solar panels of FIGS. 5A and 5B include a plurality of strips 11 containing PV material mounted on a supporting substrate 18. The strips 11 may include a single, elongated cell or several smaller cells aligned along a panel axis (FIG. 5A) and electrically connected to each directly or via a central bus. The cells aligned together along the panel axis may be connected in parallel or in series. For example, the negative electrodes of cells forming the PV strip 11 may be connected to a central bus on one side of the PV strip 11, and the positive, lower electrode may be connected to a central bus located on the opposite side of the PV strip 11.

The embodiment depicted in FIG. 5A includes a linear concentrator layer 53 having cylindrical, converging lenses 54 centered over each strip 11. In the embodiment depicted in FIG. 5B, the cylindrical lenses are replaced with a linear concentrator layer 52 having Fresnel lenses centered over the PV strips 11. In each embodiment, the lenses maybe located over the PV strips 11 and spaced appropriately so that solar energy is focused over only the width of, and over the entire length of the strips 11. The strips 11 may also be directly attached to lenses (as discussed below). The lenses 52/53 may be formed from any suitable material having a relatively low absorption coefficient. As shown, the solar flux over the length of each PV strip 11 comes from focused, refracted light R1', R2'. The top surface 53a, 52a may be convex in either embodiment (i.e., similar to layer 22 in FIG. 3C). The surfaces 18a of the substrate may have a metallic layer, or the substrate may be in-part formed from a metal so that it can serve as a heat sink. Alternatively, radiating heat fins may depend from the lower surface of substrate 18 to dissipate heat. A heat pipe may also be provided in the substrate 18 to increase heat transfer. In case of direct attachment to the lenses (as discussed in greater detail, below), the lens itself could be part of the heat dissipating medium.

In an alternative embodiment the PV strips 11 may be positioned to receive reflected, as opposed to refracted light. For example, as depicted in FIGS. 6A-6B PV strips 11 are configured relative to a lens having features of a linear parabolic lenses so that solar energy focused on the PV strips 11 is concentrated using reflected light. Thus, light rays R1 and R2 are reflected onto the PV strip 11 as rays R1' and R2', respectively, by each of the respective parabolic, linear concentrators 62. The top surface of the lens 62 may be flat (as shown) or may have a linear convex lens section centered over each parabolic lens 62a (i.e., similar to layer 22 of FIG. 3B). Although a lens having features of a parabolic is depicted in FIGS. 6A-6B and accompanying FIGS. 7A-7B, below, it will be understood that the same principles are readily applicable to other lens types, including standard type lens or a general lens type capable of focusing reflected light onto PV material in accordance with this disclosure.

Figure 7:
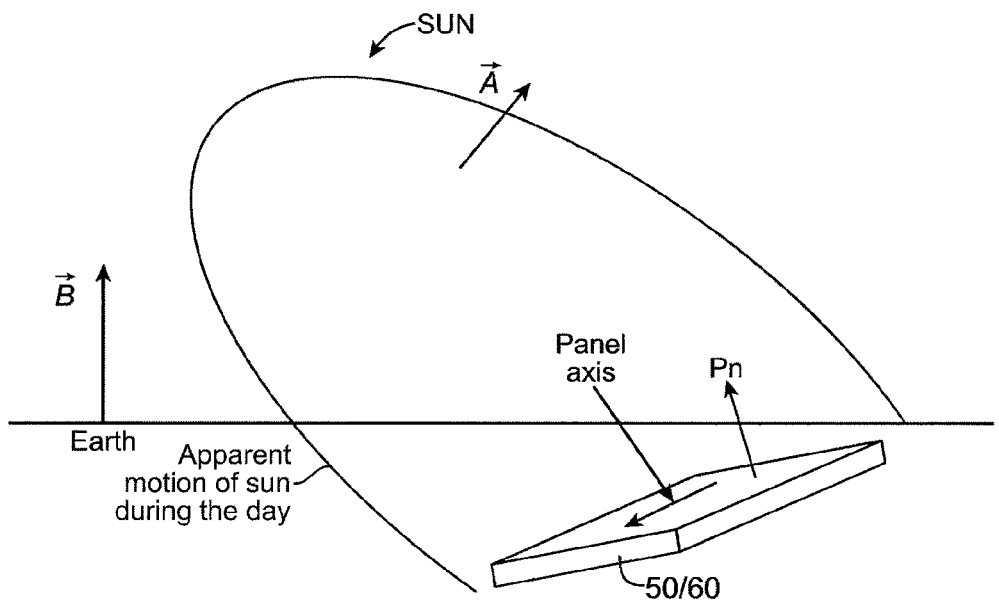
FIG. 7 depicts the orientation of a solar panel having a panel axis and linear concentrators according to FIG. 5 or 6 relative to the ecliptic plane. Unless otherwise noted, whenever a discussion refers to the direction of reflected light relative to PV material for a panel that includes linear concentrators and the orientation of the panel is not specified or otherwise apparent based on the discussion, the discussion assumes that a panel axis is fixed relative to the Earth and extends in an East-West direction, and the panel faces towards celestial equator.

The foregoing embodiments of panels 50 and 60 refer to linear or 1-D concentrators. FIG. 7 depicts the position of panel 50 (refracted light) or panel 60 (TIR or reflected light) relative to an apparent longitudinal path of the sun during the course of a day. As shown, the arrow indicating a "panel axis" may extend parallel to the lens axis for a linear concentrator. For example, a panel axis is shown relative to the PV strips 11 and line of focus for the linear concentrators 53 in FIG. 5A.

B. Tracking Panels or a Portion Thereof

Figure 8A:
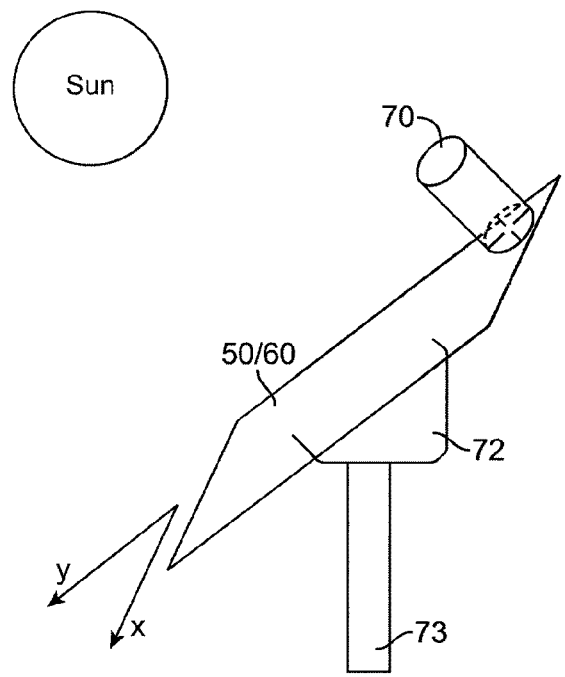
FIGS. 8A-8C depict embodiments of a sun position sensing unit that may be used on a tracking platform to track a solar panel or guide a user to locating a position corresponding to maximum solar flux.

Panels 50/60 may be tracked about a single axis or two axes using any known mechanism for rotating a solar panel so that the PV strips remain pointed directly at the sun throughout the day. For example, panels 50/60 may be tracked using the mechanisms disclosed in US 2004/0246596. Referring to FIG. 8A, panels 50/60 may be mounted to a single or bi-axis mount 72 configured for tracking longitudinal and/or latitudinal changes in the sun's position. The mount 72 may have a single or double gearing mechanism well known in the art for tracking the sun motion remotely, automatically or manually based on an input set of coordinates. The mechanism may be configured to rotate the panel through a continuous range of angles, or through discrete angular positions, e.g., 10, 20, 30, etc. degrees. To track the sun's position during the day, the mechanism 72 has a gearing or actuator (e.g., hydraulic, magnetic, or manually actuated) for rotating the panel 50/60 about axis "Y" depicted in FIG. 8A (longitudinal adjustments). For latitudinal adjustments, the mechanism, gearing or actuator (e.g., hydraulic, magnetic, or manually actuated) can rotate the panel 50/60 about axis "X". Any assembly and control system known in the art for single or two-axis rotation of a solar panel based may be used to re-position panel 50/60.

In some embodiments, a panel 50/60 has only a mechanism, gearing or actuator for translation of a substrate holding, supporting or including PV material relative to concentrator lenses as the sun changes position above the horizon, as described in greater detail below. For this embodiment, it may only be necessary to translate the PV strips 11 relative to the lenses, i.e., lenses 52, 53, as the latitudinal position of the sun changes, since the linear concentrators can collect a significant amount of the sun's energy over the course of the day without adjustment in the longitudinal direction (e.g., rotation about the "Y" axis in FIG. 8A).

In some embodiments, a sun position sensing element 70 is used to determine which way to rotate (and/or translate) the panel 50/60 so that the most direct sunlight is received on the PV strips 11 at any time during the day and/or over the course of the year. The position sensing element 70 may be rigidly mounted to the panel 50/60 (i.e., so that the position sensing element 70 moves with the panel), or the position sensing element 70 may be moved separately from the panel 50/60, in which case angular adjustments in the position sensing element 70 are communicated to the actuator or mechanism for making similar adjustments in the panel 50/60. Preferably, a position sensing element 70 is based on the relative intensities of solar energy detected by active areas of one or more photodiodes. For example, a position sensing element 70 may be made using one or more of the SPOT Series Segmented Photodiodes offered by OSI Optoelectronics (downloaded from <http://www.osioptoelectronics.com/product_detail.asp?id=20&series=Quadrant+%2F+Bi%2Dcell+Photodiodes> on Feb. 6, 2008). Such an approach for sun tracking is very low cost effective and offers a reliable and accurate method for tracking the sun's position in the sky. The position sensing element 70 uses one or more photodiodes' active areas to determine when the panel is no longer pointed directly at the sun based on the difference or change in/between/among the signal strength in active area(s) (note: the sun position sensing element 70 depicted in FIG. 8A is not drawn to its actual scale relative to the panel 50/60).

Figure 8B:
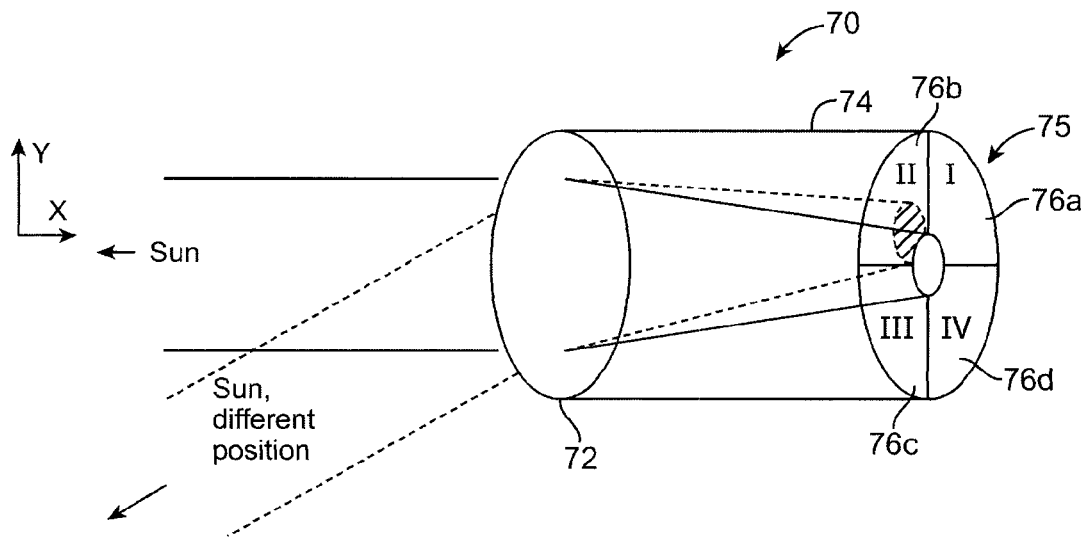
Figure 8C:
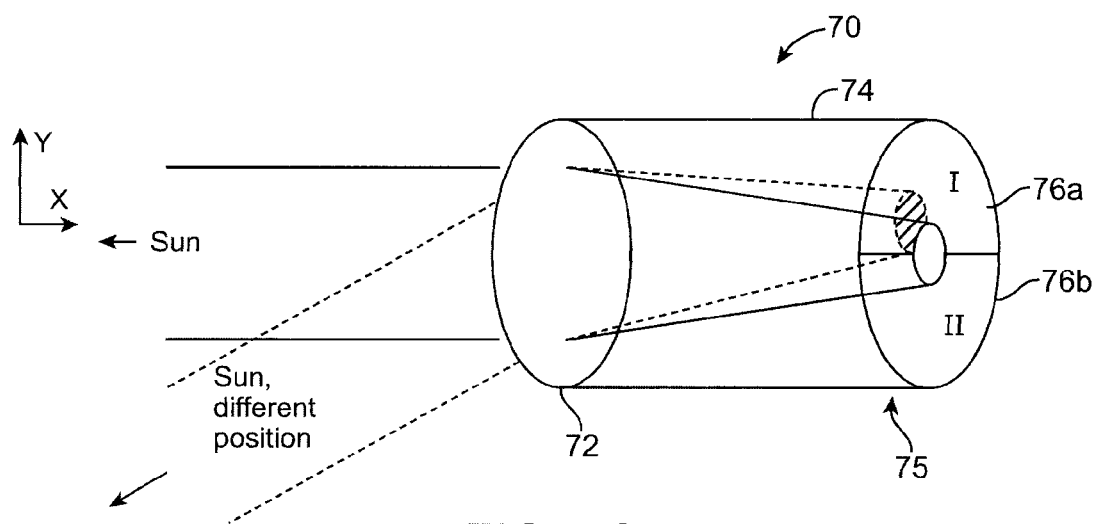

A sun position sensing element 70 may have a photodiode with four (or more) active areas and as few as two active areas for sensing the sun's position. FIGS. 8B and 8C depict two such embodiments. Each sun position sensing element 70 may have a cylindrical casing 74, an entrance end 72/73 and an image or detection plane 75. The embodiments depicted in FIGS. 8B and 8C have a converging lens 72 located at the entrance end. Alternatively, the lens may be replaced by an opaque cover having a small opening.

The embodiment of 8B has a photodiode with four active areas, 76a, 76b, 76c, and 76d arranged about a central point and defining quadrants I, II, III, IV as shown. According to this embodiment, the position sensing element 70 can detect longitudinal and latitudinal changes in the sun's position relative to the panel 50/60. For example, assume that longitudinal motion of the sun corresponds to movement parallel to the Y-axis direction and latitudinal movement corresponds to movement parallel to the X-axis direction (see FIG. 8A). If the sun moves longitudinally, then the focus point will move from the center point (where the signal intensity is about the same among all active areas 76a, 76b, 76c and 76d) to a location where most of the focused image is located in quadrants I and II. When this occurs, the circuitry will detect a difference in at least one of the pairs of signals being received from the diodes occupying quadrants I and II verses quadrants III and IV. Similarly, if the sun moves in the latitudinal direction (−X), then the signal received from the diodes in quadrants I and IV will increase over the signals received from quadrants II and III. Therefore, for the hybrid movement of the sun depicted in FIG. 8B, the signal received from quadrant II will be greater than the signals received from quadrants I, III and IV. Based on a comparison (e.g., difference) of signals, a processor may send a command signal to rotate the panel 50/60 about the X and Y axes until the signals received from active areas 76a, 76b, 76c, and 76d are approximately of equal intensity (i.e., the focused image is once again centrally located). The detection plane in the embodiment of FIG. 8C has only two active areas 76a, 76b. For this embodiment, the position sensing element 70 detects only apparent longitudinal or latitudinal motion of the sun based on a change in the signal received between diode 76a (quadrant I) and diode 76b (quadrant II).

C. Static Panels or Solar Collection Devices

In some embodiments, the costs and complexities of a tracking system for the panel 50/60 may be too much, not possible or simply not worth the effort for a given application; for example, if panel 50/60 is used as a roofing tile or otherwise formed as a layer of a building wall, or otherwise when a more simplified and cost-effective solution is needed for a year-round solar energy source. Tracking systems can be cumbersome, require maintenance, and may be difficult to maintain in climates with extreme weather changes. Additionally, the available space for mounting a panel may not be a design constraint. As such, it may be the case that a design need not concern itself with optimizing the efficiency of a panel when efficiency is being measured in terms of the total surface area occupied by the panel in relation to the power output. Rather, the design may prefer non-moving parts while providing a panel that focuses light onto PV material throughout the year, even at the expense of lowering the panel's efficiency.

The following discussion describes embodiments of solar panels capable of providing 1D and 2D increases in an acceptance angle. The embodiments include panels with and without moving parts. Examples of the later type, i.e., static panels, will be discussed first.

In some embodiments, a static solar collection device may correspond to disposing reflective material on the surfaces of a concentrator intended for concentrating reflected light onto PV material, such as in the embodiment depicted in FIGS. 6A-6B (reflective material may be disposed on surfaces 62a, 62b, 64a, 64b). In other embodiments, the PV strip position may be positioned at different locations relative to a lens axis of symmetry. In the embodiments of the solar collection devices depicted in FIGS. 5-6 all of the PV strips are located at an axis of symmetry for the lens type. This arrangement may be thought of as a solar collection device in which the spatial frequencies of the PV strips are matched with or identical to the spatial frequencies of the lenses. When the spatial frequencies are matched in this manner then all of the PV strips receive focused light at the same time. In a different sense, the PV strips collect focused light when the focused light is substantially centered at the axis of symmetry. Thus, in the embodiments of FIGS. 5-6 when the sun is directly overhead, all PV strips receive focused light. However, unless the panel is tracked, or the lenses and PV strips are moved relative to each other, then all PV strips will also not receive focused light when the sun has changed position, e.g., in case of a East-West oriented panel, from the equinox to the solstice. In the case where the PV material and lens are matched such that the entirety of the focused light strikes PV material, but any change in position of the sun causes a portion of the focused light to no longer strike PV material, the solar panel may be said to have an acceptance angle. This acceptance angle may be increased in one of two ways, by tracking the panel (in which case the acceptance angle may no longer of importance since the panel may always face directly at the sun) or by increasing the amount or location of PV material relative to lenses.

Referring now to FIGS. 9A, 9B, 10A and 10B according to some embodiments the spatial frequencies of PV strips/cells (distance between adjacent strips/cells located on a substrate) are not the same as spatial frequencies of the concentrators (distance between adjacent lens axes). Thus the value for "M" depicted in FIGS. 9A and 9B is not equal to "L". This construction allows a solar collection device to provide the same amount of focused light onto PV material throughout the year, without the need for moving or adjusting the relative position of the lenses and PV material. That is, no portion of the panel need to be moved as the sun changes its apparent position in the sky. This and other advantages of static panels, to be described below, apply equally to collection devices that use 1-D or 2-D concentrators.

Figure 23:
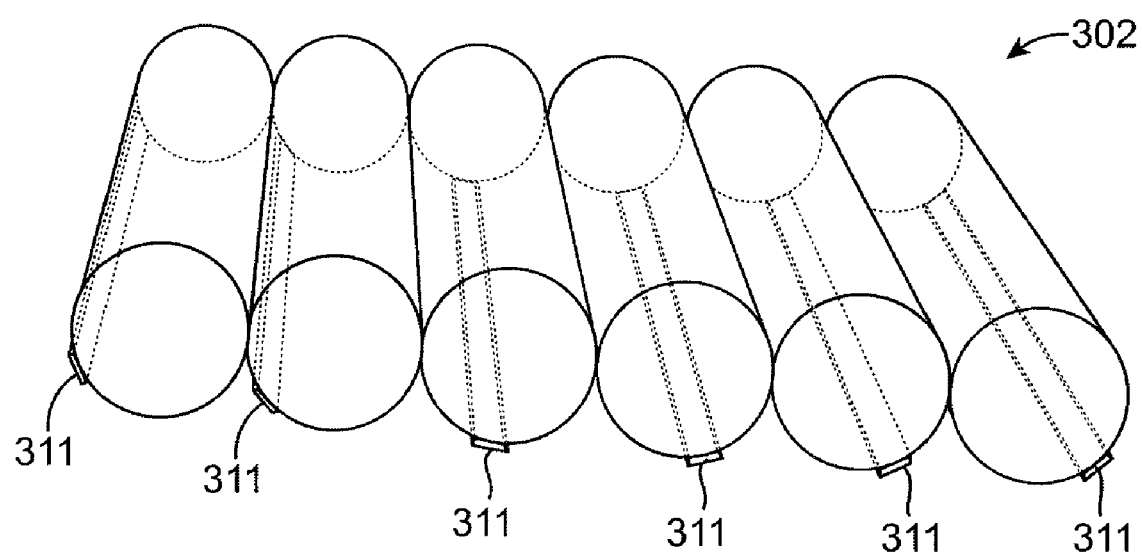
FIG. 23 depicts an example of a static solar collection device constructed in accordance with the principles discussed in connection with FIGS. 9A-9B.

PV strips 11, 12, 13 and 14 in FIG. 9A depict different positions of PV strips/cells relative to a nearby axis of symmetry for a lens (referred to as a "lens axis" in the drawings). Alternatively, these strips may indicate the different locations of a focus point for concentrators over the course of a year. These PV strips will be relied on as an example to illustrate embodiments of a static collection device. In this example, axes of symmetry for each lens may be parallel to each other. Strip 11 is located to the right of this axis and does not receive focused light when the sun is directly overhead (R1', R2'). However, PV strip 14, which is centered on the axis, would receive this focused light. When the sun has changed position (light rays R3, R4) a PV strip 12, which like PV strip 11 is to the right of an axis of symmetry, receives focused light whereas PV strip 14 (centered) and a PV strip 13 (to the left of an axis of symmetry) would not. Similarly, when the sun's position is such as represented by rays R5 and R6, PV strip 13 would receive focused light whereas PV strips 12, 14 and 11 would not receive focused light. A solar collection device having concentrators positioned relative to PV strips in a manner consistent to the foregoing description may provide a static panel feature. That is, a panel's acceptance angle can be effectively increased to follow the sun's apparent motion without itself being moved. For example, suppose the solar collection device depicted in FIG. 9A was located at the equator. During the equinox, assuming the apparent motion of the sun on equator and at equinox is solely along the panel axis (see FIG. 7), PV strip 14 would receive more solar energy than PV strips 11, 12 or 13, whereas more solar energy would be received by strips like 11, 12 and 13 than PV strip 14 during the winter solstice and summer solstice periods. Thus, a relatively constant amount of light may be focused onto PV strips throughout the year without having to physically track the panel or move a lens relative to PV material so as to follow the sun. One particular implementation of the panels described in FIG. 9A-9B is shown in FIG. 23.

The foregoing example referred to a collection device that included linear or 1-D concentrators. In other embodiments a collection device having 2-D collectors may have a 2-D capability for increasing an acceptance angle. As such, the foregoing discussion and the discussion that follows will be understood to apply equally to collection devices that include PV strips (1-D concentrator used) or PV cells (2-D concentrator used). In the 2-D case there may be a capability to increase the acceptance angle in one or two axes, e.g., along two axes that are perpendicular to each other.

Figure 10A:
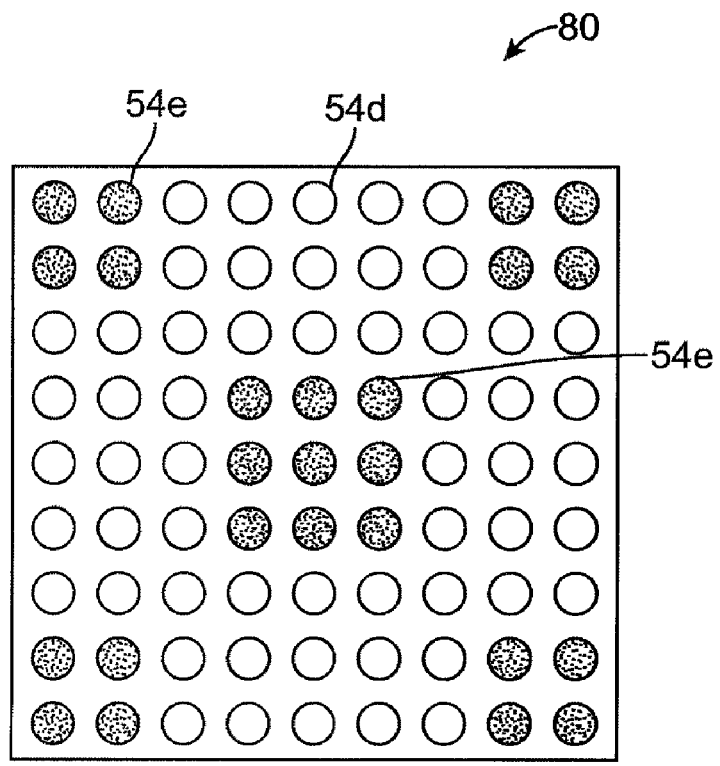
Figure 10B:
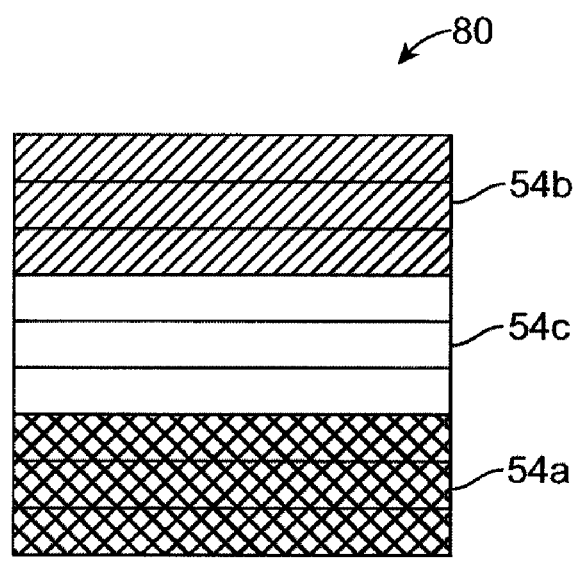

As mentioned above, in some embodiments a static device may be described by a lens spatial period ("M"), and a PV strip/cell spatial period ("L"). Assuming the panel axis is along the East-West direction and the panel is directed and fixed at the celestial equator in the sky, because L is not equal to M some PV strips receive focused light at a certain time of year whereas others do not. This concept is depicted graphically in FIGS. 10A and 10B. FIG. 10A depicts a top view of static panel 80 that uses 2-D concentrators, and FIG. 10B depicts a top view of a static panel 80 that uses 1-D concentrators. In FIG. 10A there are shown 81 spherical lens elements and in FIG. 10B there are nine cylindrical lens elements. The clear, single hatched and cross-hatched lines, a solid, respectively, indicate the periods during the year when a PV strip or cell is or is not receiving focused light. For example, referring to the case of FIG. 10B at the autumn or spring equinox a PV strip is receiving focused light from a lens element 54c, a PV strip is receiving focused light from a lens element 54b (single hatching) at the winter solstice and a PV strip receives focused light at the summer solstice from a lens element 54a (cross-hatching). In contrast, for the same spatial periods (L=M) and size PV strips all or none of the lens elements in FIG. 10B may focus light on a PV strip at a certain time of year, and/or time of day. However, since L is not equal to M, the PV strips receiving focused light may be selectively varied over the course of the year or day. As such, a relatively constant amount of focused light is directed towards PV material without a need to move lenses relative to PV material, or to actively track a panel. In the case of 2D concentrators (FIG. 10A) during a certain time of the day some of the PV material is receiving collected light (clear circles 54d) whereas others (solid circles 54e) are not. As the sun's apparent position in the sky changes, so do the lenses that direct focused light onto PV material.

As alluded to above, the solar collection device may increase the acceptance angle, statically in one axis, while the device is rotated about a second axis, i.e., the device may be both a static and dynamically device. In other embodiments the device is static in both directions by selecting a spatial frequency of PV cells in the "Y" direction (e.g., longitudinal apparent motion of the sun) and a spatial frequency of PV cells in the "X" direction (e.g., latitudinal apparent motion of the sun). These PV cell frequencies may be the same or different from each other. However, both are different from the respective X and Y spatial frequencies for the 2-D lenses (if spherical lens elements are used then the X and Y frequencies may be the same). Thus in similar fashion, different PV cells would receive focused light during the day, and those PV cells receiving focused light during a certain time of day during, e.g., the solstice period, would not receive focused light during the same time of day during the equinox. However, regardless of the time of day when the sun is in the sky, or the time of year, the solar collection device's PV cell/strip vs. lens spatial frequencies can be selected so that approximately the same amount of focused light is being received on PV material at any time when solar energy is available for collection.

In some embodiments, a method of designing or assembling a static tracking panel may be geared to arriving at a desired intersection of the spatial frequencies. For example, the patterns depicted in FIGS. 10A and 10B are, according to some embodiments, repeating and may be considered as a spatial frequency derived from the intersection or overlapping areas of the spatial frequencies. Thus, the number of PV strips/cells receiving focused light throughout the year/day may be the same as this third spatial frequency remains constant but their location shifts (e.g., clear to single hatch concentrators in FIGS. 10A-10B is a shift due to a change in the sun's apparent position from equinox to solstice) as the sun's apparent position over the day/year changes. Again, essentially the same number or percentage of the PV material may be receiving focused light throughout the year, although different strips/cells are being used to generate solar power for different times during the year and/or day.

In the foregoing examples of a static device the spacing or location of PV strips (or cells) relative to an axis of symmetry (see FIG. 9A) may be defined by a spatial frequency value. In other embodiments a static device may instead be defined by the distance of PV strips or cells from this axis. For example, in the embodiment depicted in FIG. 9B a static device utilizes reflected light, as opposed to refracted light. Since some portion of a PV strip or cell located between the concentrators (in this case parabolic concentrators) would never receive a significant amount of reflected light, it may be preferred to construct the static device by identifying a series of PV strip/cell positions relative to an axis of symmetry and then placing the PV strips at various positions within that length (e.g., a 1-D concentrator), or within that radius (e.g., 2-D spherical concentrator/two axis). Thus, as depicted in FIG. 9B the static device may have ⅓ of the PV strips (13) located to the left of an axis of symmetry, ⅓ are located at the center (14) and the remaining third are located to the right of an axis of symmetry (12). In other embodiments, more of the PV material may be located at, e.g., the solstice positions than at the equinox positions (although a lens having features of a parabolic lens are depicted in FIG. 9B, the principle is readily applied to other lens types capable of providing focused light onto PV material in view of the foregoing disclosure).

D. Dynamic Panels or Solar Collection Devices

Figure 11:
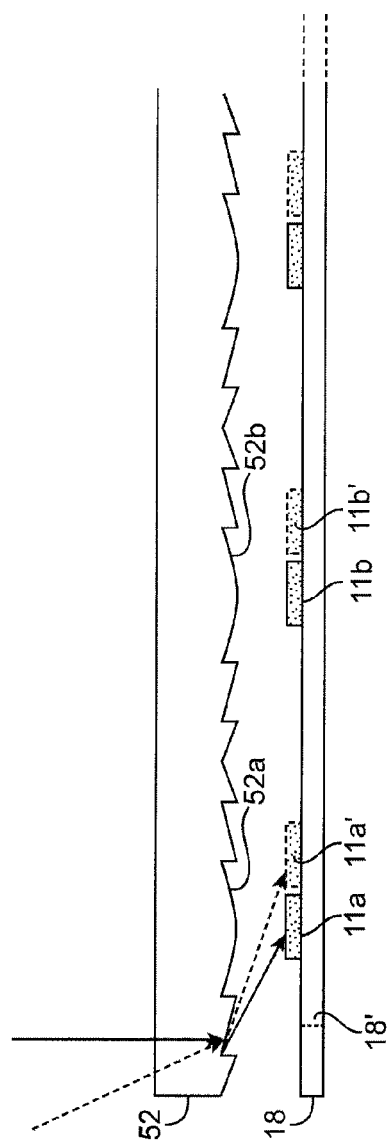
FIGS. 11 and 12 depict embodiments of a single-axis dynamic solar collection device capable of increasing an acceptance angle.
Figure 12:
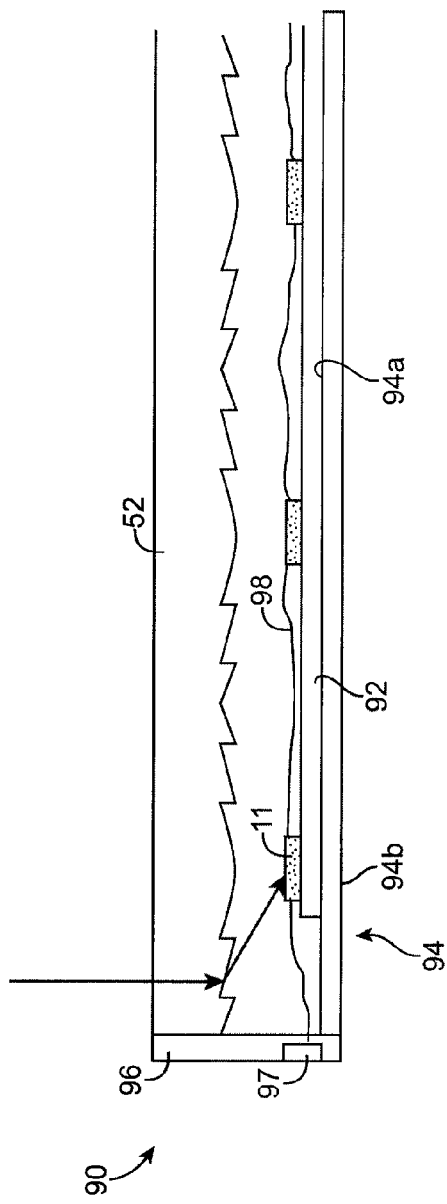

Referring to FIGS. 11 and 12, according to another aspect of the disclosure PV material or lenses are moved relative to each other to increase an acceptance angle (dynamic solar collection devices). For purposes of describing this embodiment, reference will be made to embodiments that use refracted light concentrated using fresnel-type lenses. According to these embodiments, the PV strip supporting layer or substrate 18 may be translated relative to the lens layer 52 (from position 18 to position 18') so that PV strip 11 can be moved to position 11'. Thus, the PV strips 11a/11b may be moved from positions 11a, 11b to 11a', 11b' relative to lenses 52a, 52b, respectively. FIG. 12 depicts a cross-sectional side view of a portion of a solar module or solar panel depicting schematically an arrangement of the power collection connections and inter-module connection. The arrangement for collecting power at the module level, interconnection for collecting current and transfer to a central bus, DC to AC conversion, circuit-breakers when power is shared, etc. (as discussed earlier) may be easily implemented by one of ordinary skill based on the foregoing description, e.g., as implemented in U.S. Pub. No. 2003/0111103. Solar panel 90 may include a lower frame portion 94, side frame portion 96, an electrical connection 97, wiring among the PV strips in the panel 90, and a movable substrate or platform 92 for the PV strips so that they may be re-positioned relative to lens elements of the lens cover or layer 52.

Lower frame portion 94 may have a heat dissipation side 94b that may include fins, heat pipes, or a vent for recirculation of air through the interior space of the panel. The upper portion 94a of the lower frame portion 94 may have a groove that receives a tongue or rail portion of the substrate or PV strip platform 92 so that the platform 92 can be slid over the frame 94. The platform 92 may be slid manually or by a motor when the PV strips are adjusted relative to the lens 52 in order to maximize solar flux as the seasons change. The panel may include a sun position sensing element that can be used to control the position of the platform, or the tracker may be used as a guide to locate the best position of the platform 92 when there is a manual adjustment made.

The metal connection 97 allows panel 90 to be electrically connected to an adjacent panel having a complimentary connection. Connection 97 on one side may be designated as the positive (+), and the opposing side negative (−) so that panels may be placed in series like batteries. Alternatively, the connection 97 may have both a +/− connection, in which case each panel may be connected in parallel, or for purposes of connecting panel to a like panel, on any of the sides of the panel. Thus, if the same sides of two panels are intended to be connected; one connection would be set to positive, and the other to negative.

E. Solar Collection Module

Figure 13A:
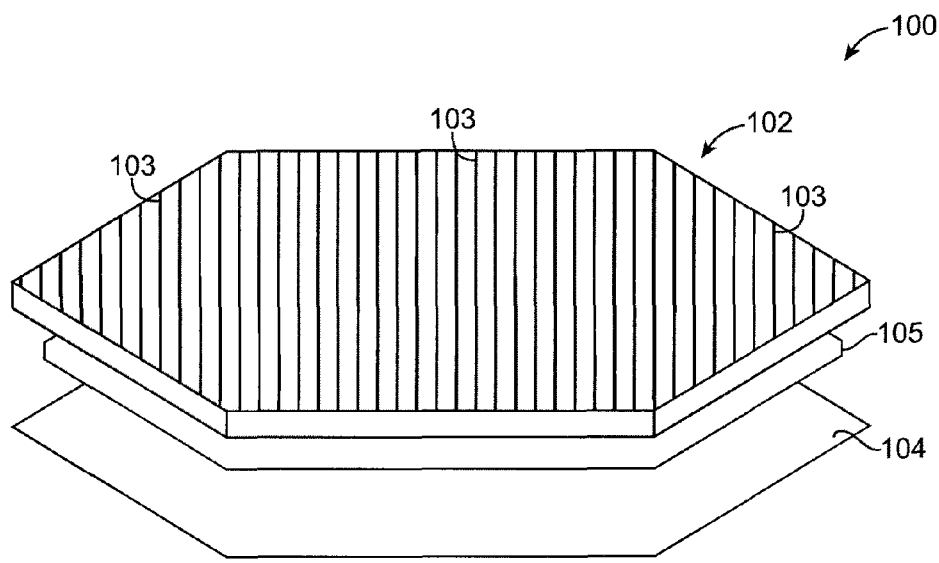
FIGS. 13A-13B depict two perspective views of a hexagonal solar collecting module.
Figure 13B:
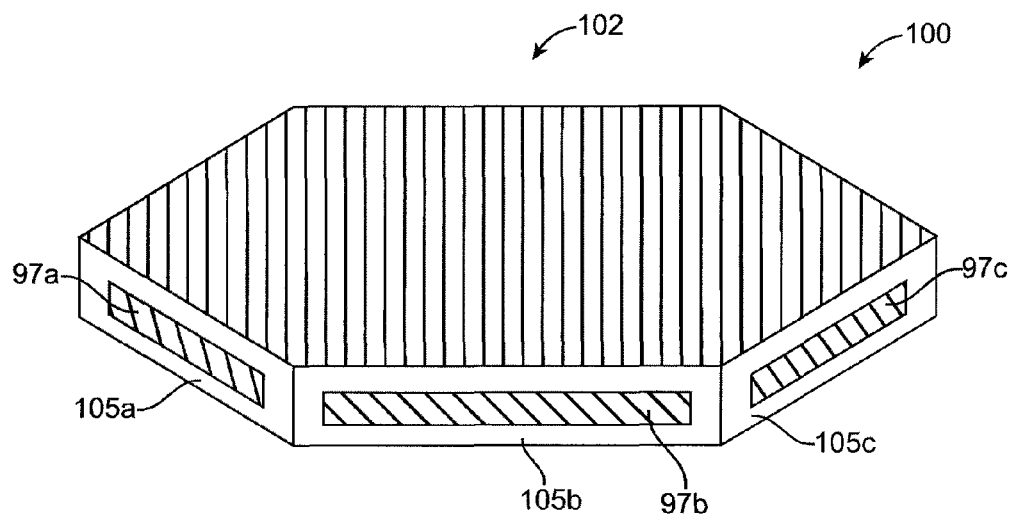

In some embodiments, the panels may be a square, rectangle or another polygon. FIG. 13A depicts a exploded perspective view of a solar panel according to one embodiment. According to these embodiments, a solar panel has four or more sides configured for being selectively connected to the same or different-sided solar panels. In FIG. 13A a solar panel 100 has six sides and thus takes the shape of a hexagon or hex. FIG. 13B shows an assembled perspective view of panel 100. Panel 100 includes a lens layer 102 that has a plurality of linear concentrators (e.g., fresnel linear lenses, cylindrical linear lenses or TIR linear lenses as discussed earlier). Layer 105 supports the PV strips, which may be orientated relative to a line of focus 103 for the lenses of lens layer 102. In some embodiments a hex panel has linear concentrators. In other embodiments, a hex panel does not have linear concentrators.

Returning to FIG. 13A, panel layer 105 may be a frame layer supporting a movable support layer for PV strips (not shown). In this case, the PV strips may be linearly shifted relative to the lines of focus of the lens layer 102 (e.g., FIGS. 11-12), or the layer 105 may be the support layer in which case the PV strips are fixed in position, e.g., the panel 100 corresponds to an embodiment of a static panel as depicted in FIGS. 10A-10B, or PV strips are fixed in position and panel 100 is coupled to a tracking mechanism. In this context, "tracking" may refer to either maintaining the surface normal parallel to the light rays (as before), or so-called partial tracking in which the sun's motion is tracked only in one direction, e.g., sun's motion that is perpendicular to a line of focus for the linear concentrators depicted in FIG. 13A.

In regards to a static panel that provides an increase in the acceptance angle, panel 100 may have different spatial frequencies between the PV strips and lens axes, as described earlier. In other embodiments, panel 100 may have PV strip spatial frequencies that are the same as the lens axes' spatial frequencies (or have all PV strips located at the same position relative to the lens axes) yet when assembled as a part of a solar collection system still provide 1-D and/or 2-D increase in an acceptance angle. For example, a first panel type can have its PV strips located to the left of a lens axis of symmetry; a second panel type can have its PV strips located to the right of a lens axis of symmetry; and a third panel type can have its PV strips located coincident with a lens axis of symmetry. According to this embodiment (assuming each panel axis is along the East-West direction and the panels are all directed and fixed at the celestial equator direction in the sky), the PV material in the first panel may receive the most focused light during the summer solstice the second panel's PV material would receive the most focused light during the winter solstice, and the third panel's PV material would receive the most focused light during the equinox. The three panels may be manufactured as separate panel types, or three of one panel type having three settings may be used. In either case, three or more panels are connected to each other to provide a static solar collection system. Accordingly, in a method for assembling a static solar collection device, the steps may include selecting different spatial frequencies or selecting different locations relative to an axis of symmetry (as discussed earlier) and then assembling a panel according to these specifications. In an alternative method, a first, second and third (or more) types of panels are constructed and then assembled together (or one panel with multiple settings) to provide a static solar collection system.

F. Hexagonal Solar Module

Panel 100 has six sides 105. Referring to FIG. 13B, there is shown three of these sides, 105a, 105b, 105c, each having a an electrical connector 97a, 97b and 97c respectively. Sides 105 also may include a connector structure for connecting to another hex panel. Each side 105 may have both a male and female connector type so that any side 105 of one panel 100 may be connected to any other side of an identical panel type. Further, when sides of two panels are engaged with each other, the connectors 97 may be automatically placed in abutting contact, such as by mounting the connector face on spring-biased mounts (i.e., biased outwardly from the panel side 105) such that when the sides are brought together, e.g., by sliding one panel into contact with another, or pushing one face/side 105 into another, the connectors 97 are pre-loaded to press into each other while the panels remain connected to each other. The connectors 97 may include multiple connector types, e.g., selectable positive or negative current flow connectors, power connector and connector for controlling the linear position of PV strips relative to lenses, output power signal or solar flux indicator (for monitoring whether there is an optimal position of PV strips relative to lenses or panel orientation relative to the sun).

The solar panels or modules of the embodiments set forth in the disclosure may be mounted in a variety of fashions. For example, the hex panel 100, or a square/rectangular or circular panel of other embodiments that incorporate principles of the disclosure may be mounted on roofs as roof tiles, or other structures that provide an unobstructed line-of-sight to the sun's path over the sky throughout the year. This may be a slanted or flat roof, a side of a building, etc. Sometimes it is difficult to position solar panels during installation so that they are orientated in an optimal position for collecting solar energy (i.e., in a position that does not become shaded during part of the day); individual panels may be difficult to replace when repairs are needed; or the available space limits the number of panels that can be safely mounted. Further, the available space for the panels may not be orientated so that a panel, especially a panel having linear concentrators for focusing light, can be positioned properly with respect to the sun's path because of limited space or the size of the panel(s). In other words, the panel axis does not lie within the ecliptic plane.

Figure 14A:
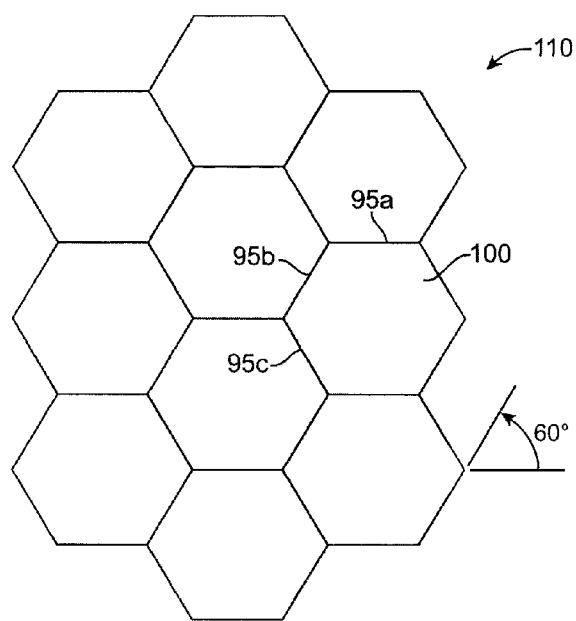
FIGS. 14A-14B depict top views of a solar panel, or solar collecting unit assembled from hexagonal solar modules according to the embodiment of FIGS. 13A-13B.
Figure 14B:
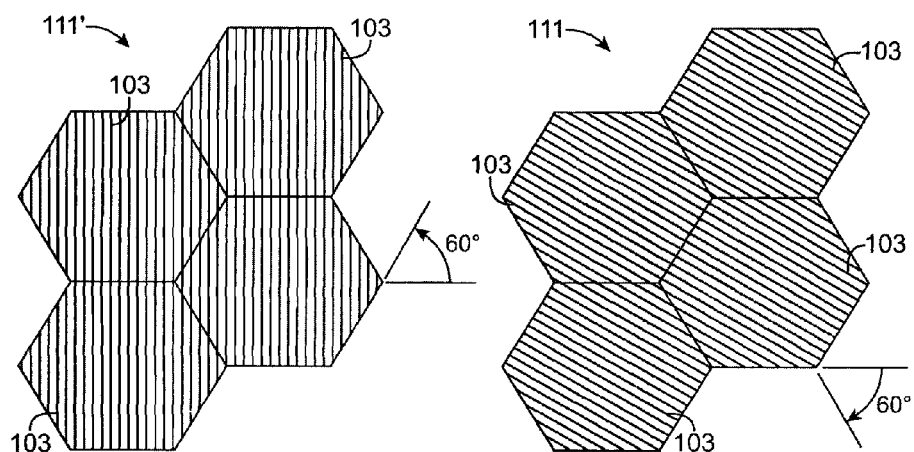

Referring now to FIGS. 14A and 14B, there is shown a top view of several hex panels connected together to form a solar collection unit 110, and a portion 111 of the solar collection unit 110, respectively. As can be appreciated, since each of the panels 100 may be connected to any one of the sides of other panels, in any orientation, there is a great diversity of configurations for a solar collection unit that are made up of panels that have greater than four sides, such as a hex configuration. This may be desired as it can allow a user to make the most use of available space. Indeed, a hex may be preferred over a square or rectangle for this reason.

When a hex is used in combination with linear concentrators, there is another advantage. If the path of the sun relative to the panel mounting space allows a square or rectangular panel with linear concentrators to be aligned perfectly, i.e., so that the panel axis lies within the plane of the sun's daily path, or it is 90 degrees from the panel axis, then the panel can be easily aligned and all available space used because the panels can be placed side-by-side. However, if the space is orientated at an acute angle, e.g., 30, 45, 60 etc. degrees, relative to the plane of the sun's path (as if the panel was rotated about its normal axis $P_n$ in FIG. 7), then it may be difficult to orient the square/rectangular panel so that the panel axis is orientated correctly. And even if this could be done, there could be unused space for placing solar panels. The angular orientation needed for alignment would prohibit some panels from being placed because there was insufficient space.

For example, a square roof will be used to mount square solar panels having linear concentrators (i.e., single-axis, or static panels according to the above embodiments). If the sun's path is at 30 degrees relative to panel (i.e., 30 degrees rotation about axis $P_n$ in FIG. 7), then the panels must be orientated at 30, 150, 210, or 230 degrees so that the line of focus for the linear concentrators follows the path of the sun from sunrise to sunset. This results in wasted roof space for the square panels, and probably a special mounting, or additional supports are needed in the roof so that the panels can be oriented at 30 degrees (as opposed to 90 or 0 degrees) and safely supported.

When panels having linear concentrators are arranged as hexes 100 there are three different angular orientations available (60, 120, 180), as opposed to only two (90 or 180) when a square or rectangle is used. Thus, a hex panel is more versatile than a square because it can be positioned in an additional angular orientation without there being unused space, or without requiring a customized mounting arrangement to accommodate a roof/wall that is not ideally faced towards the sun (e.g., the broad side of the roof does not face north/south). Hexes 100 may be easier to mount than squares or rectangles. For instance, for a hex-shaped mounting frame, a single mounting position for rooftops may accommodate a greater variety of roof positions (relative to the sun) than a square type mounting frame. If the proper orientation of the panel axis is at an angle to the direction in which structural members of the roof or wall are orientated (e.g., frames, studs, or other hard points for mounting the panel mount), then it may be difficult to properly orient a four-sided panel because additional support would have to be added, or a specialized mount made so that the four side panel could be arranged at an angle such as 30, 60, or 120 degrees relative to the horizon. However, with a hex panel 100 configuration, the same mounting scheme can be used for a greater variety of roof positions because there is three different positions available for the same roof mounting scheme. This feature is depicted in FIG. 14B. As shown, each hex may be rotated among 6 different positions, i.e., a 0, 60, 120, 180, 240, and 300 degree position. In other embodiments a circular panel type allows almost any orientation for the panel axis without having to re-configure the panel mount on the surface of the building or home.

In other embodiments, panel 100 includes 2-D concentrators. These embodiments include embodiments in which panel 100 is capable of increasing an acceptance angle in two directions. By orientating multiple panels among 60 degree angle increments, the panel can in more cases be closely aligned along one of two orthogonal axes that correspond to a spatial frequency axis for PV cells/concentrators than a panel having four or less connecting sides.

G. Portable Solar Collection

A solar panel incorporating one or more of the foregoing embodiments may also be configured as a portable solar panel. A portable solar panel may allow a significant reduction in the storage, transportation and mounting of solar panels to a roof or exterior wall. In other embodiments, a portable solar panel be used for camping, hiking or other outdoors activities, as an emergency power source for automobiles when there is a breakdown, e.g., recharge an automobile battery, etc.

Figure 15A:
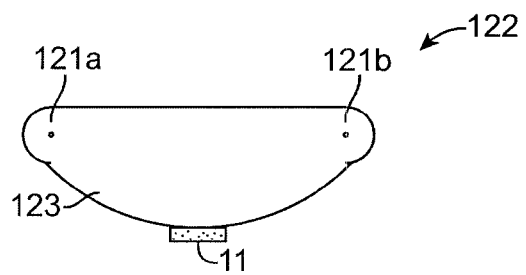
FIGS. 15A-15C depict aspects of embodiments of a portable or roll-up solar panel.
Figure 15B:
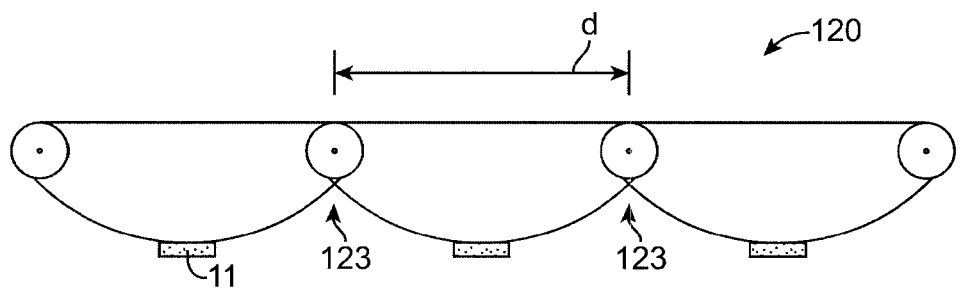
Figure 15C:
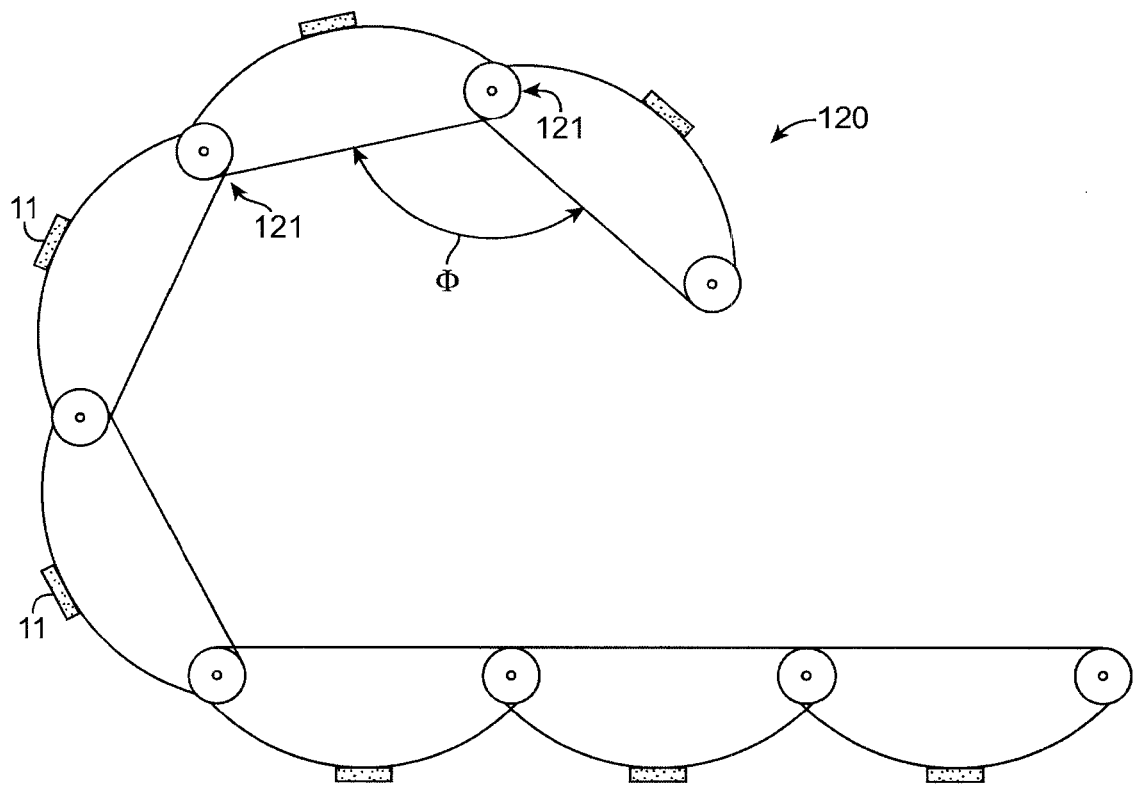

Referring now to FIGS. 15A-15C, there is depicted a partial schematic representation of a solar panel according to an additional aspect of disclosure. Solar panel 120 is composed of individual, interconnected solar collecting elements 122. Each of these elements includes a linear PV strip, e.g., PV strip 11, secured to a linear parabolic lens 123. According to these embodiments, the PV strip 11 is arranged at the location of TIR for the parabolic element, as discussed previously in connection with the embodiments of FIG. 7 or 10B. Each of these elements includes a hinge connector 121a, 121b located at opposite ends. The hinges 121 may be easily snapped to mating hinges of other elements to form a foldable solar panel 120 as depicted in FIGS. 15B and 15C. The hinges may alternately be living hinges. Further, the solar panel 120 may be assembled from a kit by snapping together each of the elements at their hinge points, and then connecting output terminals to a central bus for current collection.

The width (d) of each element can be between 5-10 mm or any other dimension. The elements rotate between a stowed (or rolled-up) to a deployed configuration with hinges that permit rotation through an angle $\Phi$ (see FIG. 15C). Although not shown, it will be understood that each element 123 (or kit) may also include a lower cover that contains the necessary electrical connections for connecting each PV strip to a neighboring strip, and also to protect the electronics inside from damage. The cover may be fluid impermeable and sufficiently rugged so that the panel may be used in a wide variety of outdoor environments.

H. Additional Examples of Static/Dynamic Panels & Solar Collection Devices

Referring to FIG. 16A, a solar collection device 200 may include concentrators 202 configured for focusing refracted light onto PV strips 11. According to some embodiments a solar collection device may be configured for increasing an acceptance angle in a direction transverse to the lens axis of the cylindrical type lens depicted in FIG. 16A. In some embodiments this may be accomplished by configuring the panel as a static panel and in other embodiments by configuring the panel as a dynamic panel. As an example of these embodiments reference will be frequently made to rod lenses having a circular cross section. However, it will be understood that the same principles apply to other linear concentrator types. As explained below, one advantage of a circular cross-section is that the individual rod lenses may be packed closely together when rotated to follow the sun, since the circular geometry allows each to rotate relative to a neighbor without interference.

Referring to FIG. 16B, a frontal view of three rod lenses 202 shows that the direction of the solar rays R1, R2, R3 are at an angle $\theta$ to the vertical. In this example the PV material is secured to the bottom of the lenses 202, so that when the lenses 202 rotate so does the PV material. According to this embodiment, the lens elements 202 may be rotated as shown, thereby pointing the PV material 11 towards the direction of the light rays R1, R2, R3. This rotation may be accomplished by applying a torque $T_o$ about an axis as shown in FIG. 16B. This axis may be coupled to a linkage mechanism, such as opposed linkages 204a, 204b and 206a, 206b configured to rotate each of the lens elements through a corresponding angle $\theta$ by displacement of arms 204b, 206b in opposing directions +/−x (as shown). The lenses may therefore have annular, or partially annular flange formed at their ends that mate with grooves in arms 206b, 204b so that the lenses 202 may roll between the displacing arms 204b, 206b.

FIGS. 16C and 16D depict two embodiments of a rod lens and PV material assembly. In each case solar rays originate from directly overhead. However, the concentration factor for the lenses is different. In this particular example, the difference in concentration factor is attributed to a difference in the index of refraction between the material used, i.e., the lens in FIG. 16C has an index of refraction n=n1, and the lens of FIG. 16D has an index of refraction of n=n2. The ratio of the length over which the light is received (in this case, the diameter of a circle) to the length over which the focused light is distributed on the PV material (c1, c2 respectively) is the concentration factor, e.g., the concentration factor for the lens in FIG. 16C is diameter times (1/c1).

As depicted in FIG. 16C the length c1 is smaller than the length "d" of the PV material, whereas in FIG. 16D d=c2. The former relationship (c1<d) may be used to provide a static panel that has a larger acceptance angle, as opposed to a condition in which d=c. When c=d, e.g., as depicted in FIG. 16D, a dynamic panel, e.g., the panel embodiments just described in connection with FIG. 16B may be used. In the case of a static panel, as the sun's position changes the focused light continues to focus on PV material because d>c1. In the case of a dynamic panel, the lens must be rotated as the sun's position changes because d=c2. The condition of d>c may be expressed indirectly as an "Exposure-to-Collection Ratio" (ECR) for a panel. The ECR is intended to mean the ratio of the exposure area, e.g., c1, to the collection area, e.g., d. Thus, in the example depicted in FIG. 16C the ECR would be c1/d<1. The ECR varies inversely with a static panel's acceptance angle.

In the embodiments of the static or dynamic lenses discussed in connection with FIG. 16 the rod lenses 202 may be made from such material as glass or plastic. The lenses may be solid or glass or plastic tubes, or hollow circular tubes that are filled with a transparent liquid which acts as a dielectric. The liquid may be circulated through the center of the lenses to also serve as a heat sink.

In some embodiments, a solar panel may be arranged so that the panel is substantially translucent. For example, the solar panel 300 depicted in FIG. 17A has a series of rod lenses 302 supported by a frame structure 308. This panel may be configured such that it appears essentially translucent since there is no opaque substrate located beneath the rod lenses. The frame assembly 308, which includes parts 305, 308a, 308b support the concentrators 302 at essentially their peripheries so that diffused light may pass through the panel. This will cause the effect of the panel blending into its environment more, so that its presence is not as noticeable. For instance, if the panel sits atop a roof, the panel will tend to blend into the roof design more so that it is not as noticeable to someone looking at the roof. In some embodiments, the support 308 may be thought of as suspending the concentrators above the rooftop.

Figure 17A:
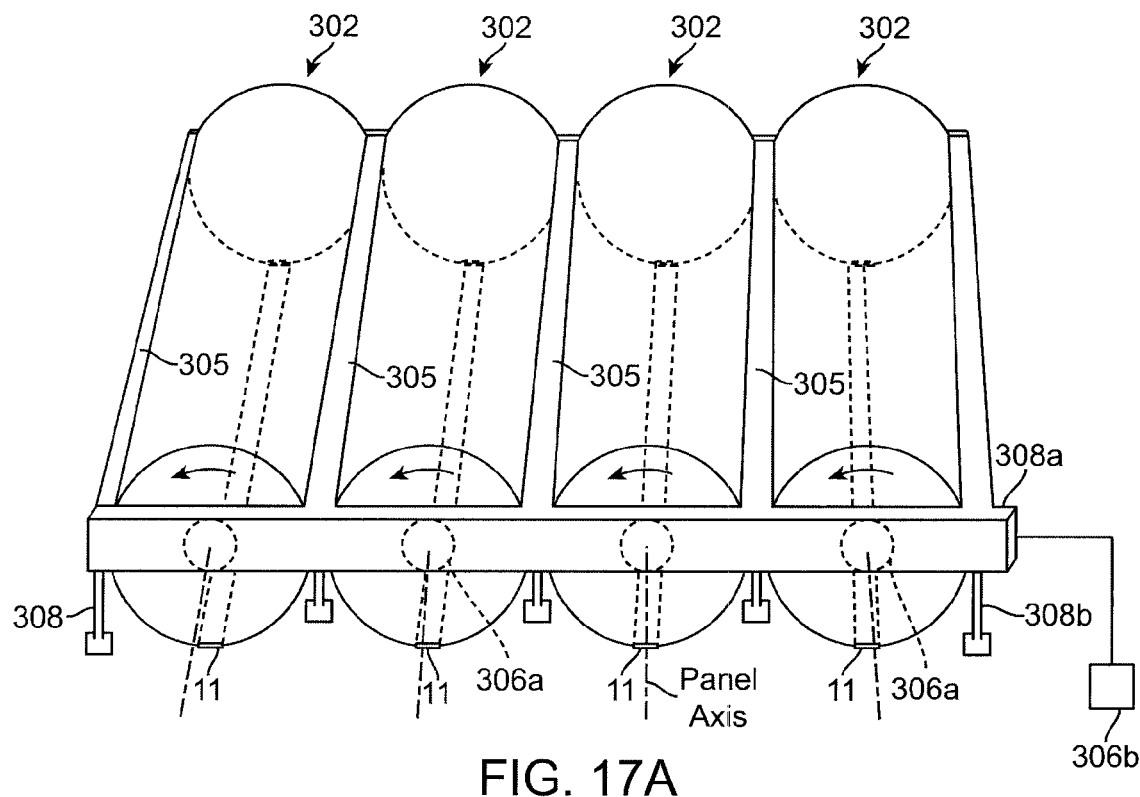
FIGS. 17A-B depict perspective and frontal views of a solar panel according to another aspect of the disclosure. This solar panel is constructed to dynamically follow the sun and includes a translucent construction and sweeping/cleaning portions that are integrated into the support frame for the panel.

The frame support may be configured for supporting a static panel or dynamic panel design, as discussed earlier in connection with FIGS. 16A-16D. In FIG. 17A a dynamic panel is depicted. Frame 308 includes, at the nearest ends of the concentrators 302 in FIG. 17A a housing 308a within which there is a coupling 306a to a rotary motor or drive 306b for rotating the concentrators about their longitudinal axes as the sun's apparent position changes. The coupling (e.g. FIG. 16A and related discussion) supports the concentrators 302 at one end. At the far end there may be a similar coupling for driving the concentrators or a housing assembly that receives a post formed at the end of each of the concentrators. This support which permits free rotation of the concentrators about their axes while supporting in the translation directions.

Figure 17B:
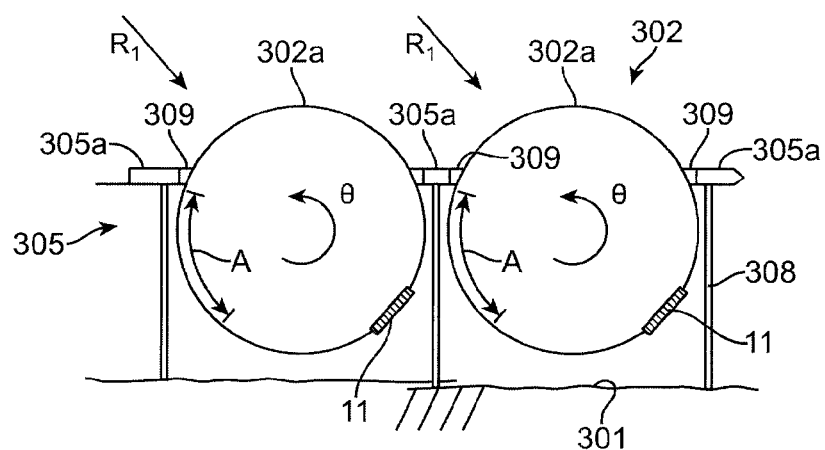

Between the ends 308a there may be mid-span supports 305 for the concentrators 302. These mid-span supports may include, or form cleaning or sweeping strips that can sweep or clean the surface of the concentrators 302 when the concentrators 302 are rotated to follow the sun. Referring to FIG. 17B, which shows a portion of a frontal view of the panel 300, the mid-span support 305 are configured to have cleaning or sweeping strips 305a located at positions that do not interfere with the collection of solar energy, and on each side of the concentrators 302. A surface-contacting portion 309 (e.g., a rubber-like material, Teflon, brushes) slides over the outer surface 302a of the concentrator 302 to essentially sweep the surface free of debris. As the linear concentrators 302 rotate through an angle θ to follow the path of the sun, the contacting surface of the cleaning strips 303a slide over the corresponding length of the outer surface 302a (i.e., arc length "A" depicted in FIG. 17B) of the linear concentrators, thereby automatically sweeping the surface free of any dirt, dust or water that may accumulate. The cleaning strips 305 can reduce the frequency in which the panel may need cleaning to maintain the panel's efficiency. Thus, in the embodiments in which a dynamic panel is selected, the cleaning strips 305 may be added to assist with cleaning the surface of the concentrators without little added cost or complexity. Further, the strips 305 present a solution to the need for frequent cleaning of panel surfaces that are in hard-to-reach places or exposed to relatively large amounts of dust or dirt.

In some embodiments, the drive assembly 306b and associated programming (i.e., daily, seasonally, etc.) for following the sun may include an additional cleaning cycle. In these embodiments, the motor or drive may rotate the concentrators through a 180 degree angle for cleaning purposes, e.g., at nighttime. In some embodiments, the frame may also include a cleaning solution, or simple water that flows over the cleaning strips to assist with removing debris or dirt from the surface of the concentrators 302.

In some embodiments, the solar collection device may include a cover on all sides, one side, two sides, e.g., opposing sides, or no covers at all. As will be appreciated, there are advantages and disadvantages in each case and depending on the application, there may be a preference for having covers completely or partially covering the solar collection device, or no covers at all.

As mentioned earlier, a panel 300 according to the disclosure may be constructed so that it appears essentially translucent when viewed from positions outside of the direction where light collects on the PV material. In other embodiments, the solar panel may include a combination of translucent structure, and opaque, semi-transparent, and/or patterned surfaces to provide an aesthetically pleasing, intriguing or eye catching appearance to a structure, e.g., a rooftop of a home or building. The patterns or designs may be formed over the unused portions of the concentrators, i.e., the portions of the concentrators which do not focus light onto PV material.

Figure 18A:
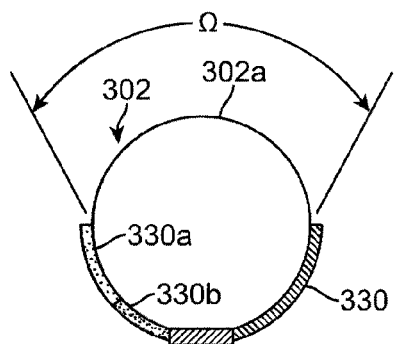
FIGS. 18A-18D depict solar panels according to another aspect of the disclosure. The solar panels include one or more patterns formed on unused portions of a concentrator for the purpose of creating a pattern, image, etc. to persons viewing the panel.
Figure 18B:
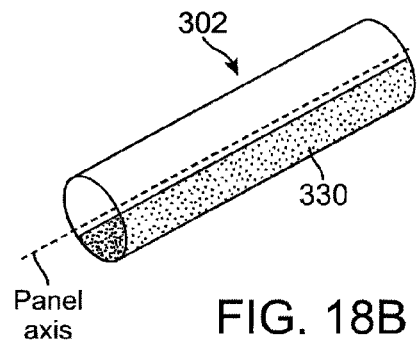

Referring to FIGS. 18A-18B, there is depicted examples of this aspect of the disclosure. Referring to FIGS. 18A, 18B a rod lens 302' of an alternative embodiment of panel 300 includes an opaque pattern or image 330 formed on the unused portion of this cylindrical lens. The pattern may be formed on the concentrator by painting, etching, or a variety of techniques for creating a desired shape or appearance to the concentrator when viewed outside of the direction where light is collected on the PV material. FIG. 18B shows a perspective view of the concentrator 302. The type of pattern is indicated by patterns 330a, 330b. The surface area occupied by the pattern may be determined from the range of angles where light is expected to be collected and focused onto the PV material, as indicated by the angle Ω, i.e., the left and right extremes where solar energy is collected by the lens.

In one example, the pattern on a concentrator may be the same as adjacent concentrators (e.g., a color complimentary to the roof color). In some embodiments, the pattern may be chosen to portray a message, display, e.g., a flag, to serve as an advertisement, i.e., a brand name, or to simply reflect a pleasing pattern. In some embodiments, multiple patterns may be provided when a dynamic panel is used. For instance, the arrays of concentrators 302 depicted in FIG. 17A may have a pattern 330 (FIG. 18A) formed on the unused surfaces of the lens, including a first pattern 330b and second pattern 330a formed on the left-hand-side of the PV material 11 (FIG. 18A), or on both the left and right hand sides of the PV material 11.

Figure 18C:
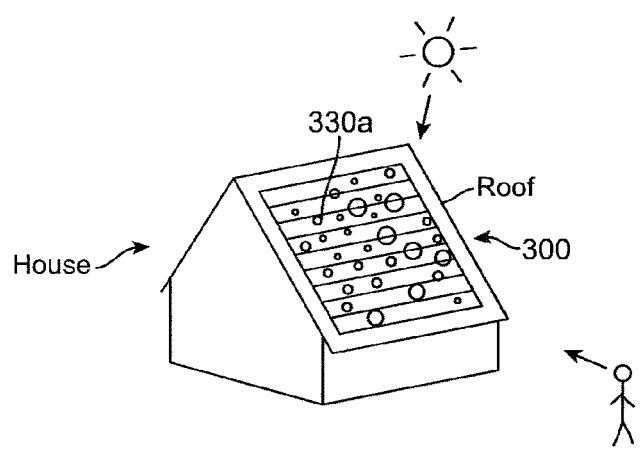
Figure 18D:
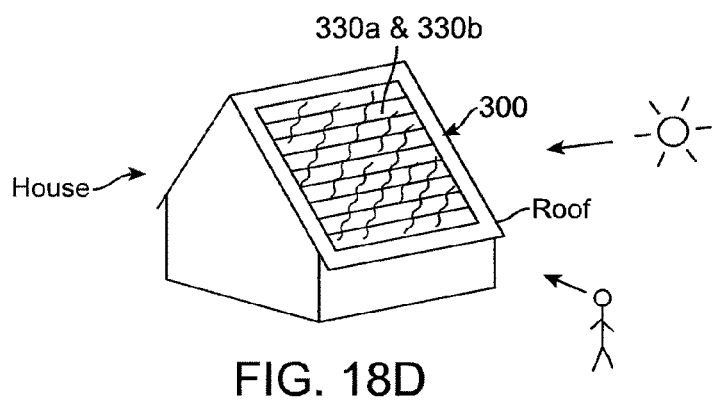

FIGS. 18B and 18C show how such a panel 300 may appear to an onlooker at different times of the day. The panel 300 is shown mounted atop a slanted rooftop and is visible to a person (as shown). In FIG. 18C the sun has a first apparent position in the sky overhead, e.g., noontime sun, while in FIG. 18D the sun has a second apparent position in the sky, e.g., late afternoon. When the sun changes its position, the panel 300 (a dynamic panel) will rotate the concentrators 302 in unison so as to keep the PV material facing the sun. When this rotation has occurred, the person viewing the roof will notice a change in the pattern created by the array of concentrators. For the sun position depicted in FIG. 18C, the person will only see pattern 330a. When the sun as moved closer to the horizon (FIG. 18D) the concentrators rotate, which causes both pattern 330a and 330b to become visible to the onlooker. In another embodiment, the panel may be configured so that a pattern, e.g., pattern 330a, becomes visible to the onlooker only later in the day. Before that time, the panel 300 appears to blend into the roof color or pattern. Thus, the disclosure also encompasses dynamic solar panels that may provide aesthetically pleasing designs, serve as a late day advertisement (e.g., pattern 330a, when it becomes visible displays in the aggregate over all concentrators an advertising slogan, brand, image or message)

Figure 19:
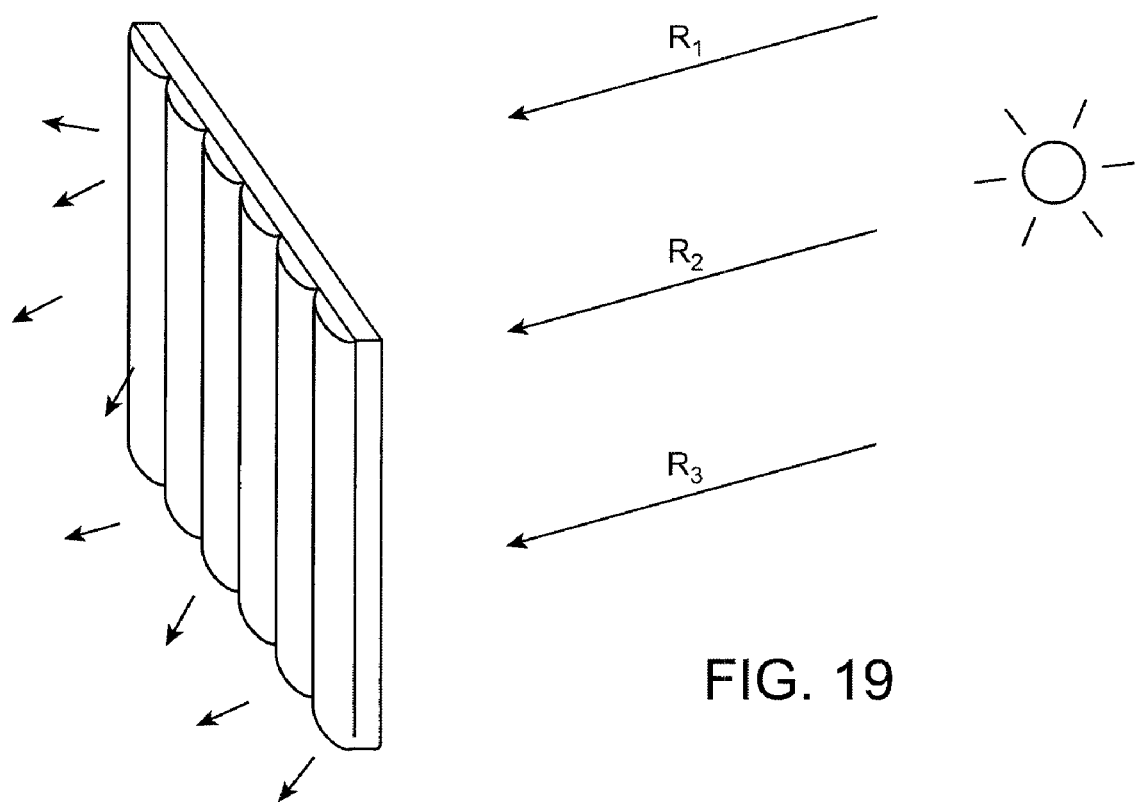
FIG. 19 depicts a perspective view of a solar panel that is mounted or disposed over a window. The panel may be constructed in a similar manner as described in connection with the embodiments of FIGS. 16 and 17. The solar panel may form a curtain over a window. The curtain may be configured to allow diffused light to pass through while collecting direct sunlight on PV material. In a related embodiment, the solar panel can also be hung as a curtain over a window where the curtain also does not allow diffused light to pass through. In this case, the curtain may function similar to a Venetian blind. It could also be integrated inside a window

According to another aspect of the disclosure, a solar panel is configured for being disposed over windows. In some embodiments, the solar panels may be static or dynamic panels, as described above, and may be positioned to cover windows, or be incorporated inside a window, and function as Venetian blinds or coverings that allow diffused light to pass through. Such placements of solar energy collectors may be especially advantageous at areas of high or low longitudes, i.e., far away from the Earth's equator, where the sun travels close to the horizon. For instance, a solar panel, e.g., one constructed in a manner consistent with panel 300 and discussed in connection with FIG. 17A, that is located in the northern hemisphere (latitude of about 35) and mounted over south-facing windows of a high-rise building collects roughly 70 percent of a roof mounted panel of the same size over the course of a year. Such a mounting is depicted in FIG. 19. The concentrators 302 are arranged to extend from ground level upwards but may also be arranged to extend horizontally. For the embodiments in which the solar panel 300 is translucent (as discussed earlier), the panel 300 may cover the window continuously. As the sun comes into view, only diffused light passes through the panel 300, while the direct light is collected at the PV material.

In the embodiments of a solar collection device utilizing a linear concentrator the panel axis may be orientated east-to-west, north-to-south, or indeed in other directions depending on the location of, and/or optics used in the solar collection device, or based on other reasons. In the examples discussed above and depicted in the drawings, e.g. FIG. 5A, reference has sometimes been made to solar collection devices in which the panel axis was orientated to face east-to-west. However, it will be understood that the various aspects of the disclosure discussed above in connection with solar collection devices having 1D concentrators apply equally to collection devices in which the panel axes are not orientated in an east-to-west direction. Thus, the disclosure is not limited to collection devices with 1D concentrators having panel axes intended to be orientated east-to-west.

I. Other Examples

Figure 20:
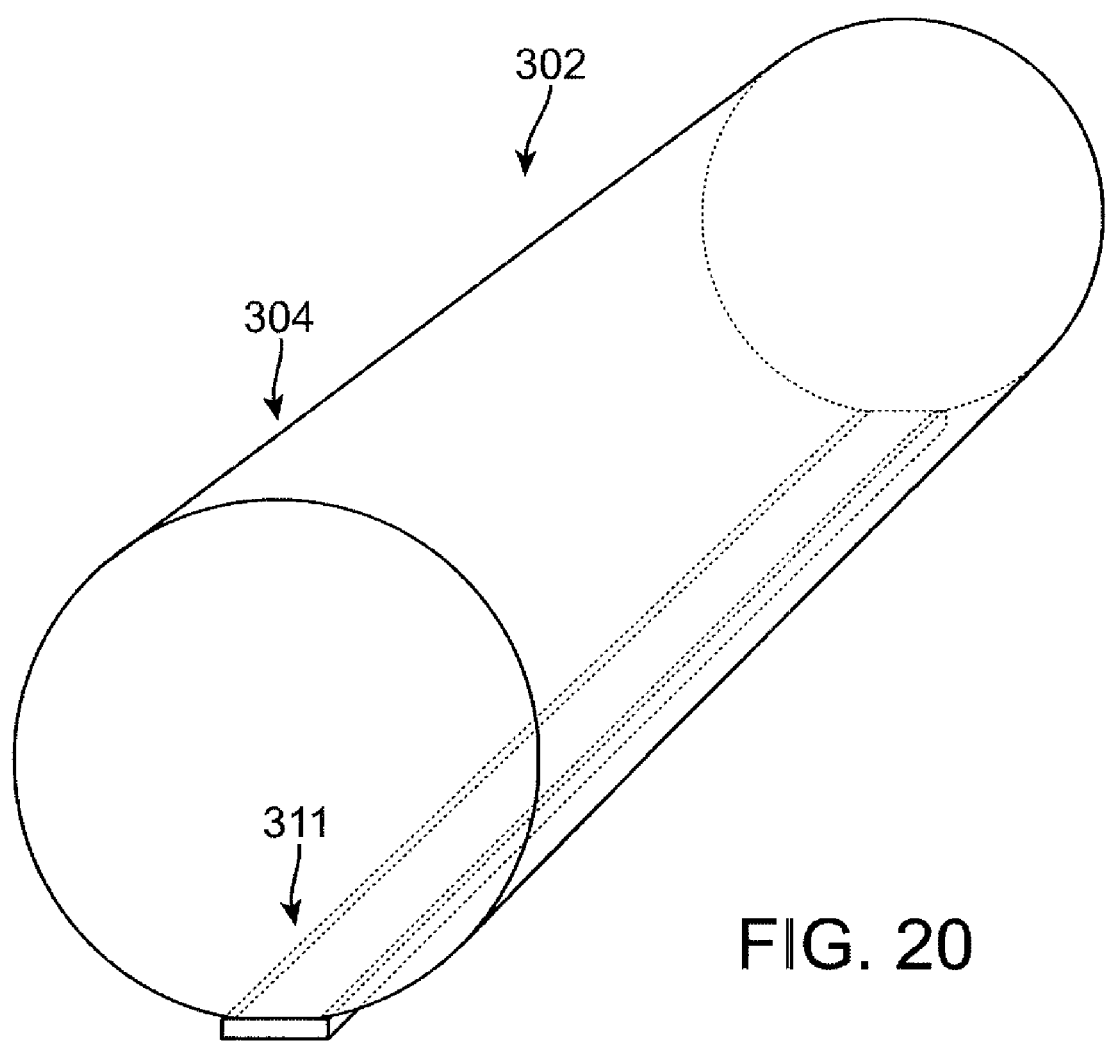
FIG. 20 shows perspective view of a solar collecting element including a circular rod lens with attached PV strip.
Figure 21A:
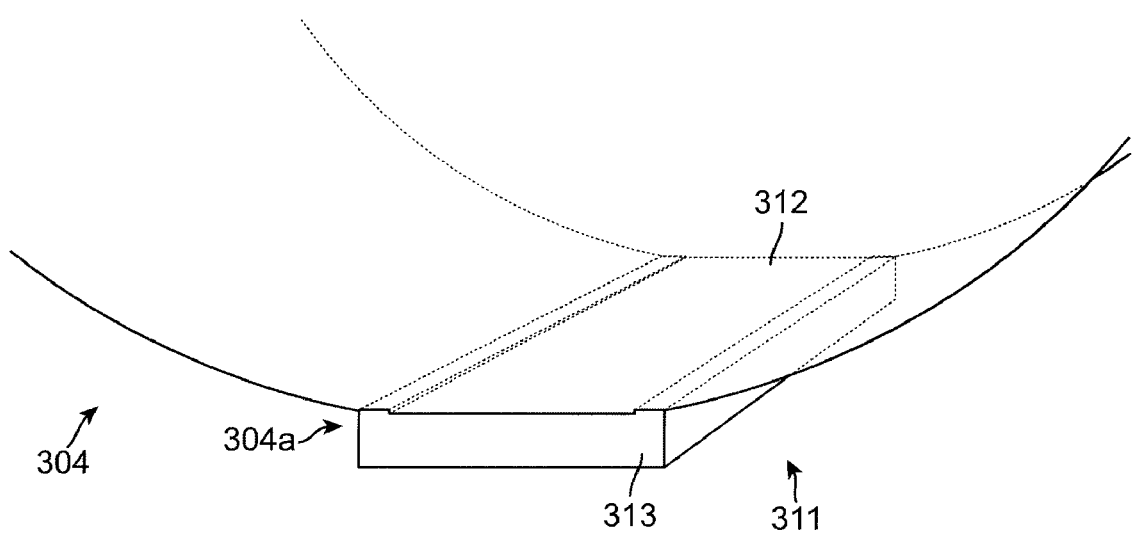
FIGS. 21A-21B show portions of the solar collecting element of FIG. 20 according to embodiments with and without additional concentrators, e.g., reflecting elements, positioned adjacent a metal grid for conducting current. The concentrators may be incorporated into the solar collecting element in accordance with one or more of the embodiments discussed in connection with FIGS. 3-4.
Figure 21B:
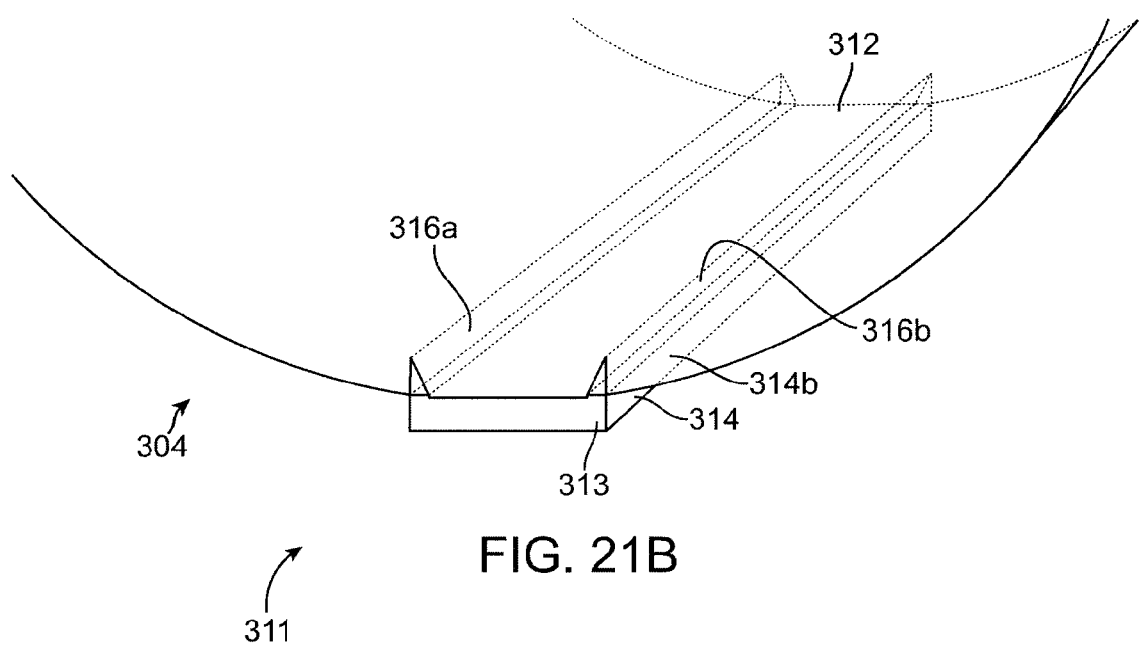
Figure 21C:
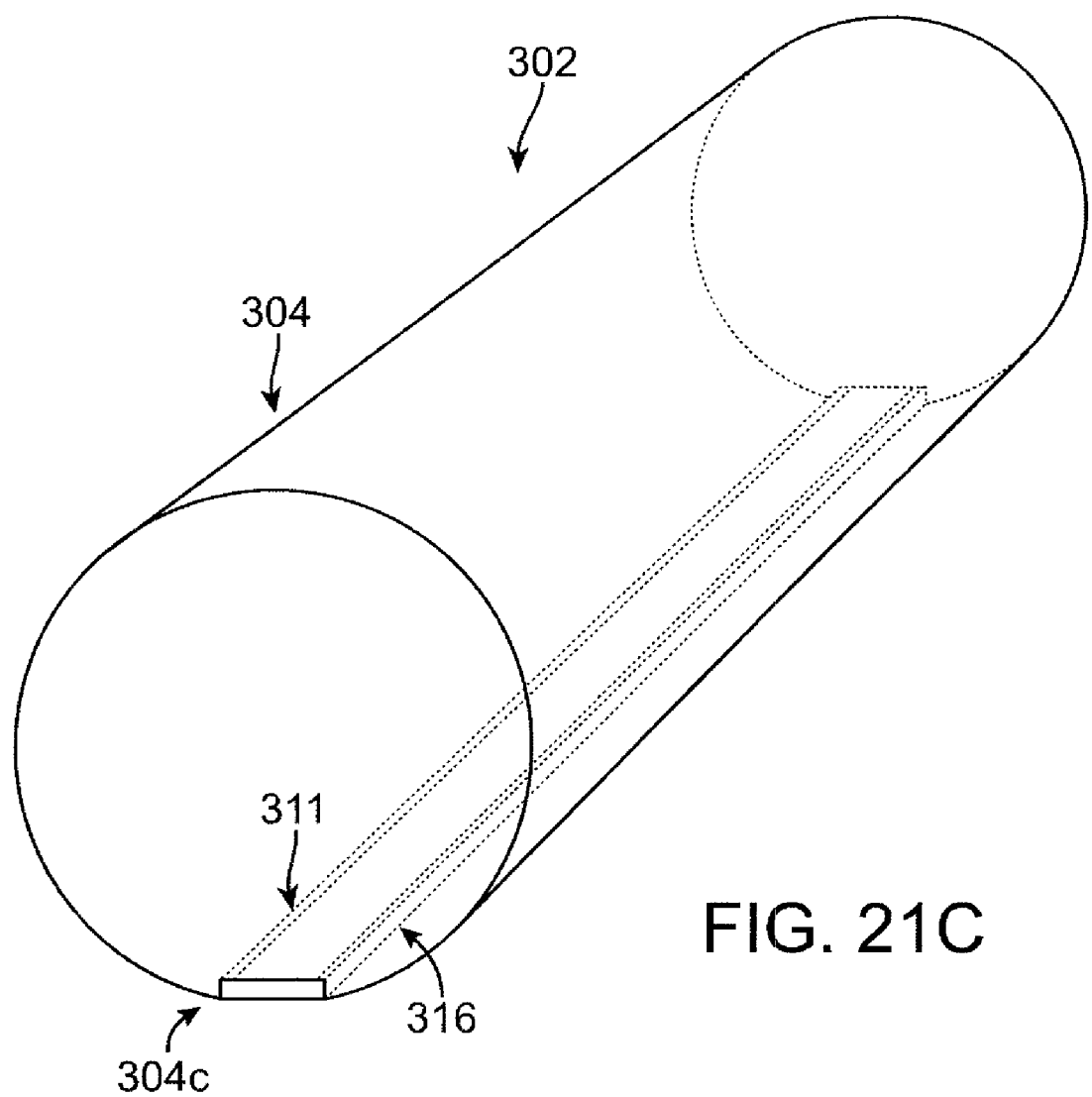
FIG. 21C depicts another embodiment of a solar collecting element including a circular rod lens with attached PV strip. According to these embodiments, a groove may be formed in the lens. The metal grid and concentrators may then be attached within the groove, e.g., with a suitable adhesive.

FIGS. 20 and 21 depict embodiments of a solar collecting element 302 having a circular cross-section rod lens 304 with a PV strip 311 attached to the lens 304. Referring to FIG. 21A, showing a close-up view of the collector of FIG. 20, the PV strip 311 may be attached to the lens by an index-matching glue. The PV strip 311 includes the PV material 312 and current conducting metal grid. In some embodiments, the PV material may be secured to a rod lens by chemical vapor deposition, evaporation, electroplating, or other suitable manufacturing techniques. The PV strip 311 may be secured to the outer surface of the rod lens 304, or secured to a pre-formed groove in the rod lens 304 (see FIG. 21C).

FIG. 21B depicts an embodiment in which TIR reflectors 316 are disposed over the portions 314 of the metal grid 312 in the collection plane. The TIR reflectors 316a-316b may be fabricated as part of the PV strip 311, e.g., as depicted in FIGS. 3-4, or formed into the rod lens portion 304a that receives the PV strip 311. As discussed earlier, the TIR reflectors 316 reflect solar energy away from the metal grid 316 and towards the PV material 312. Refracting lenses may be used in place of lenses arranged for TIR, as discussed earlier in connection with FIGS. 3-4. For the embodiment depicted in FIG. 21B, the TIR reflectors are received within grooves formed along the outer surface of the rod.

FIG. 21C depicts another embodiment of a solar collecting element including a circular rod lens with attached PV strip. According to these embodiments, a groove 304c may be formed along the outer surface of the lens. The metal grid 316 and PV strips 311 may then be placed within the groove 304c, e.g., with a suitable adhesive. In some embodiments, the concentrator according to FIG. 21C may include a TIR reflector such as depicted in FIG. 21B, or an assembly in accordance with other examples of refracting and/or reflecting structure adapted for redirecting light from a metal grid towards the PV material as discussed previously in connection with FIGS. 3-4.

Figure 22A:
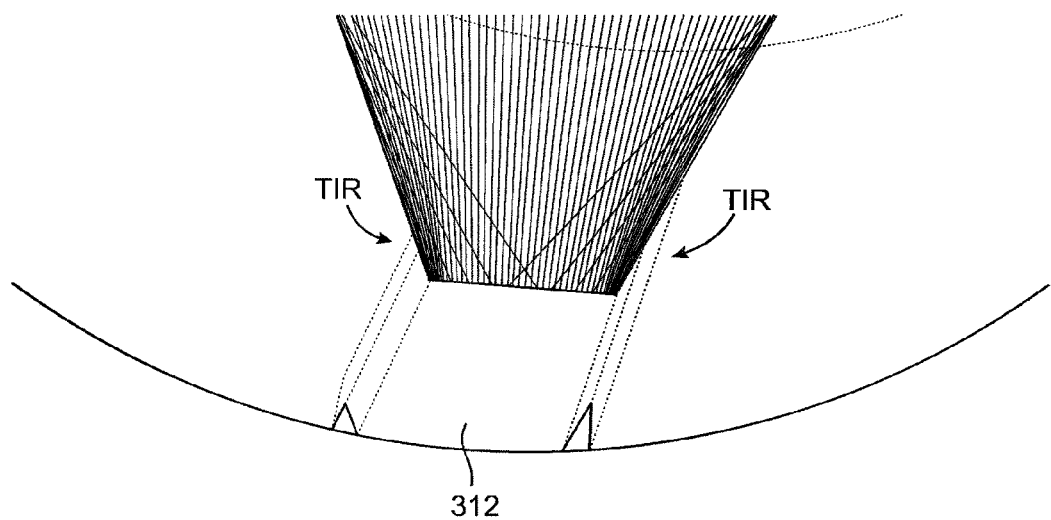
FIGS. 22A-22D show ray traces for various embodiments of a solar collection device.

FIGS. 22A-22D show ray traces for a solar collection device having a series of rod lenses 302 arranged parallel and side-by-side (examples of such a solar collection device are discussed in more detail in connection with FIGS. 16 and 17, above). Referring to FIG. 22A, this ray trace was calculated based on the optical properties of the collecting element depicted in FIG. 21B. The effect of the TIR reflectors is evident in this ray trace. At the edges the light which would normally be received at the metal grid is reflected towards the PV material.

Figure 22B:
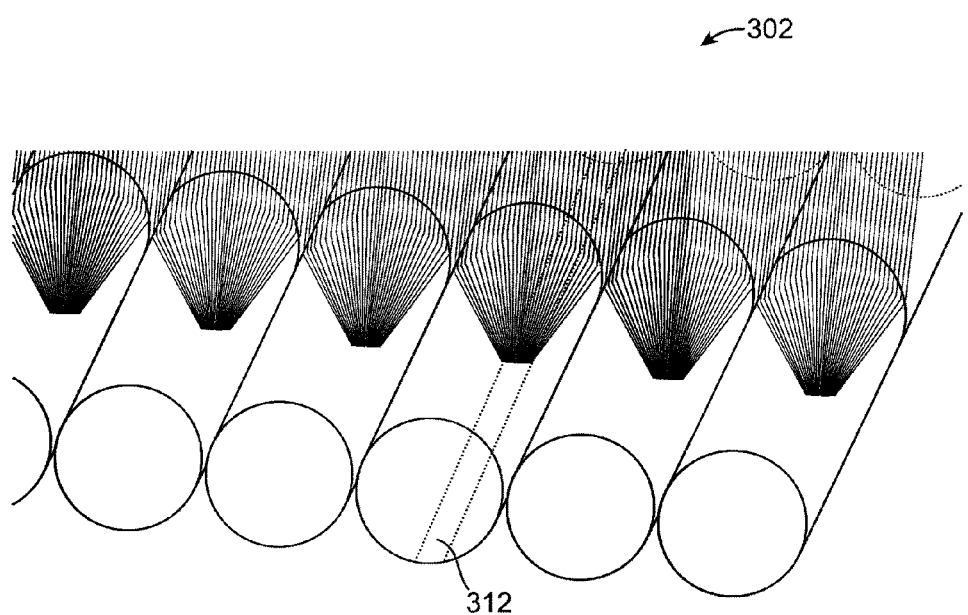
Figure 22C:
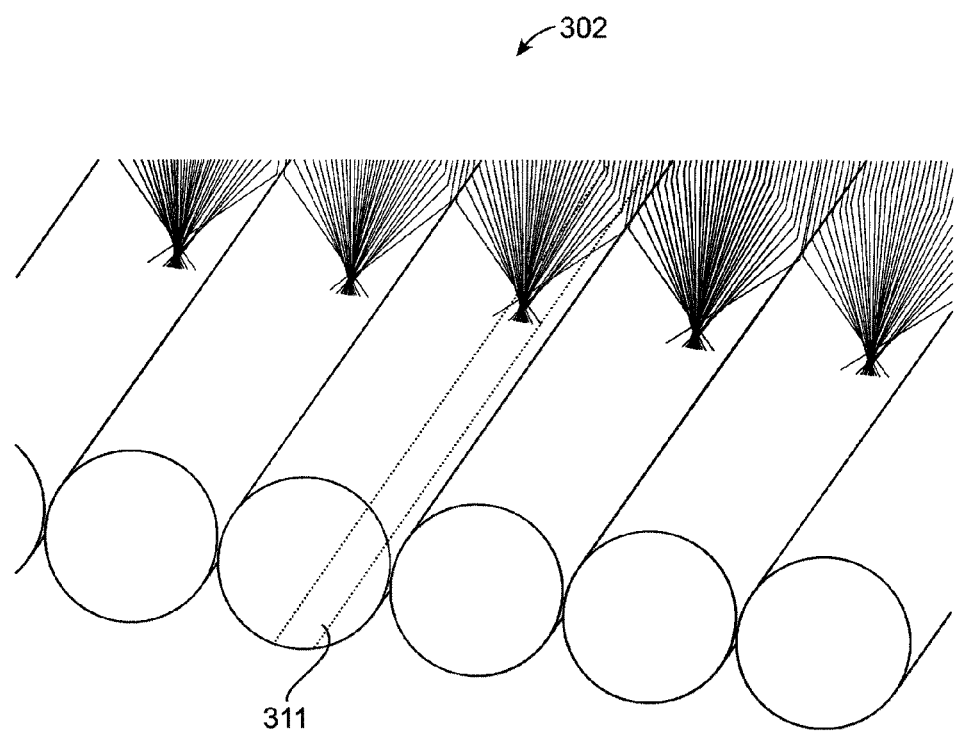
Figure 22D:
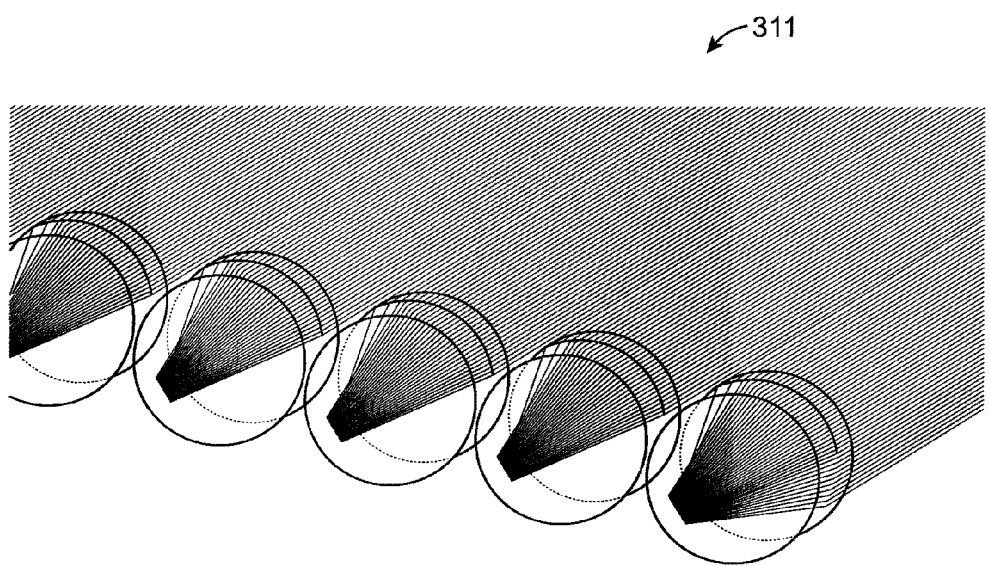

A ray trace for a series of collecting elements placed side-by-side is shown in FIG. 22B. In this example the light source is located directly above the PV material. FIG. 22C shows a ray trace when illumination is at 45 degrees from normal in the plane defined by the rod lens 304 longitudinal axes. FIG. 22D depicts a ray trace for collection device in which the rod lenses are rotated about their longitudinal axes. IN this case the light source is also at 45 degrees form normal. As can be seen, the PV strips are maintained in focus when the light source is at 45 degrees from normal.

FIG. 23 depicts an example of a static collection panel having the PV strips arranged according to a spatial frequency. In accordance with the principles discussed in connection with FIGS. 9A-9B, the orientations of the PV strips about the lens longitudinal axes (lenses 302 have PV material located at different angles about the lens longitudinal axis) provides the collection device with PV material that is in focus for one part of the day, and not in focus for another part of the day. In this way, there may always PV material in focus for collecting solar energy, without tracking the panel.

Figure 24A:
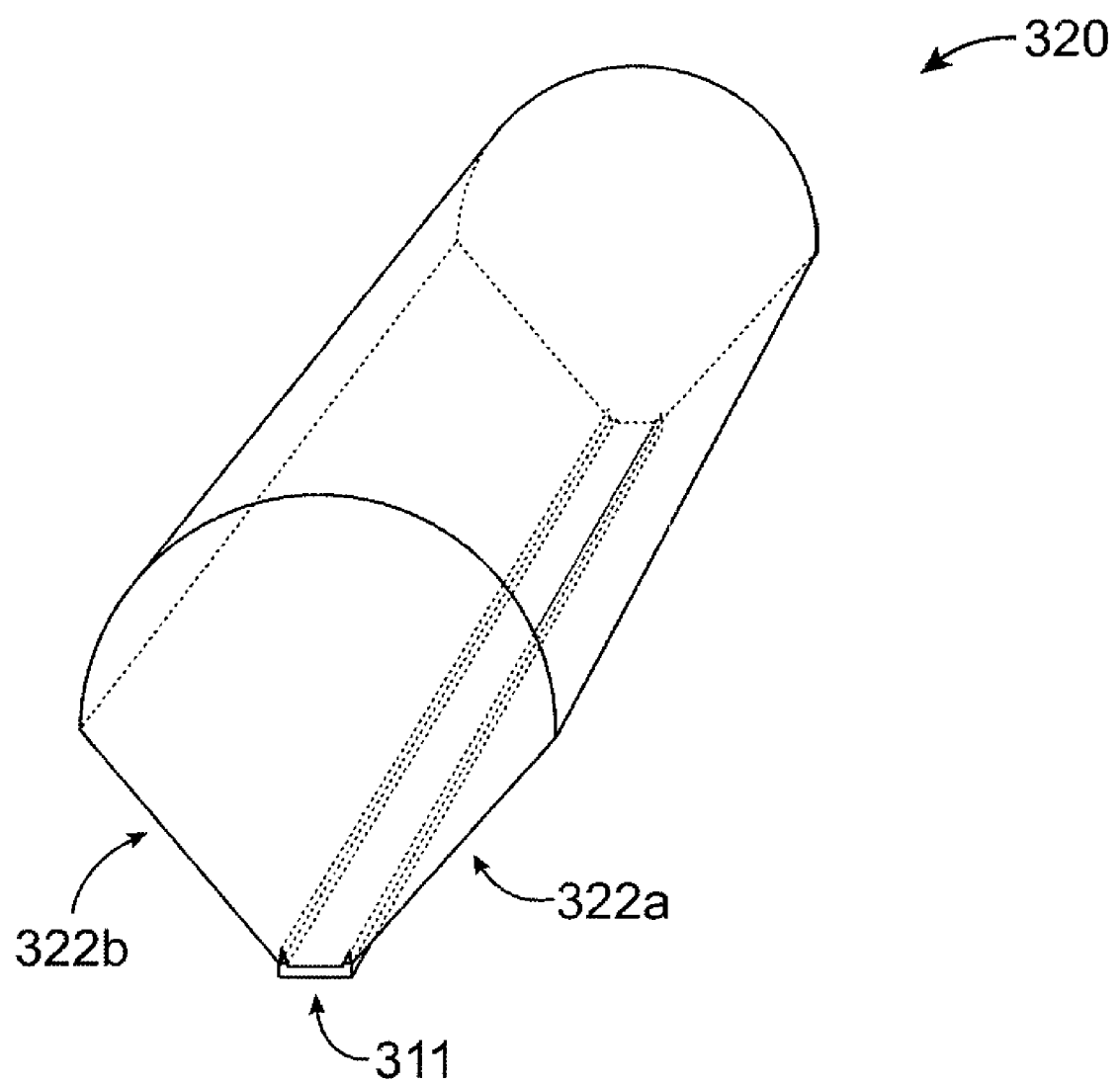
FIG. 24A depicts one embodiment of a linear concentrator having unused (not focusing light) portions of the lens removed.

FIG. 24A depicts embodiments of solar collection elements in which a rod lens of circular cross section is cut to remove unused portions of the lens (i.e., the portions of the lens which are not used to focus light). For instance, in FIG. 24A there are cut-outs 322a, 322b. The portion of the lens removed at these locations are not used to focus light (see ray traces in FIG. 22). It may be desirable to make such cut-outs as a way of reducing the weight of glass rods in a panel. It may also be desirable to make such cut-outs to enhance the transparency of the panel.

Figure 24B:
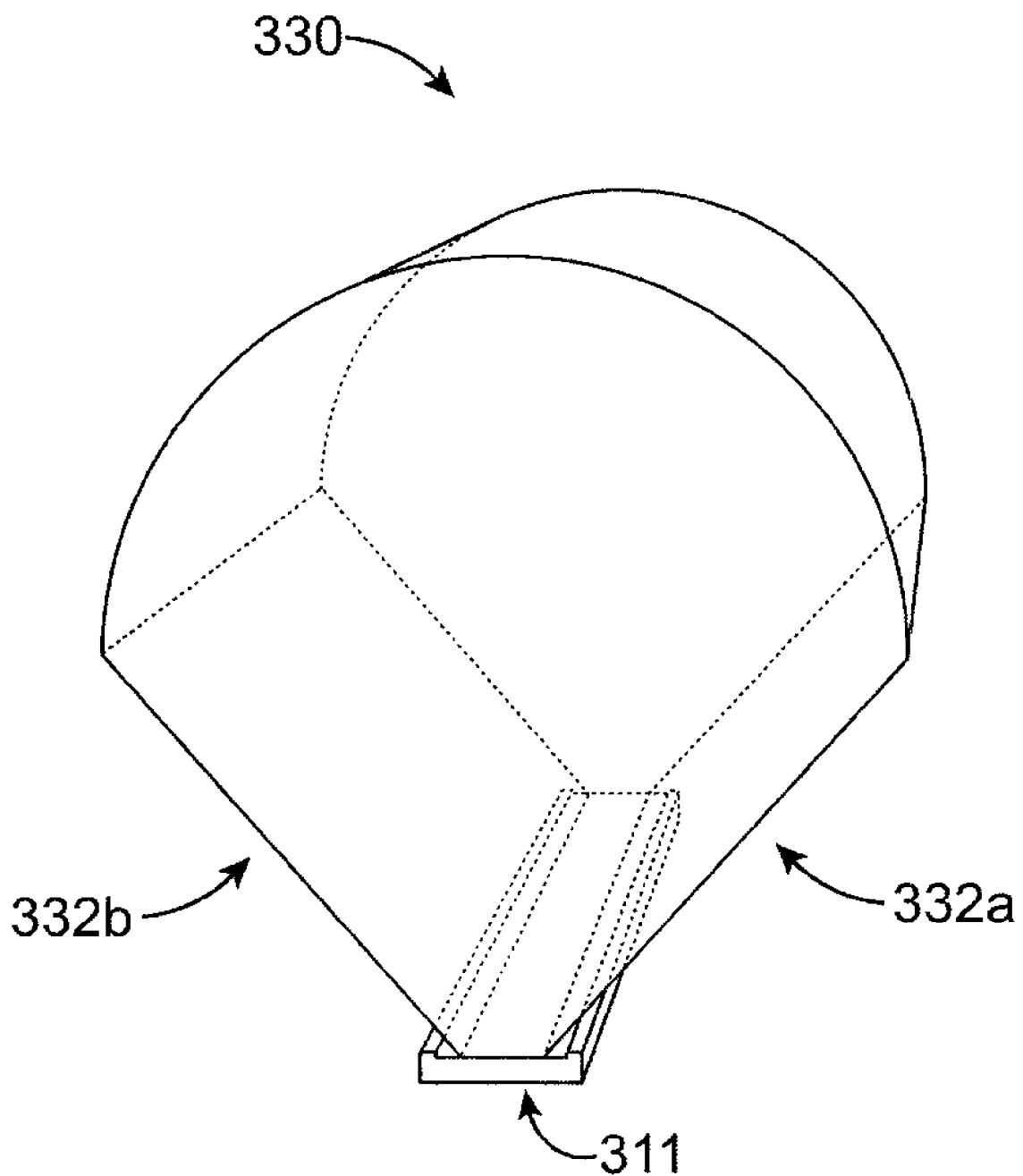
FIG. 24B depicts one embodiment of a linear concentrator in which the sides of a lens, e.g., a cylindrical rod lens, are shaped to reflect solar energy towards a thinner strip of PV material. In this example, a rod lens having a circular cross section has its sides partially removed to produce straight, tapered walls extending from a convex outer surface portion to the PV material. The tapered walls may be formed so as to produce TIR, thereby increasing the concentration ratio for the concentrator.

In FIG. 24B the cut-outs are made in such a manner as to create TIR reflectors for the solar collecting element 330. Sides 322a, 322b extend down to form a more narrow collection plane. Such a design can create a factor of two increase in the concentration ratio due to TIR, e.g., from 5 to 1 to 10 to 1, in addition to weight reduction and enhanced translucency of the panel. Use of the word "cut-out" is not intended to indicate that one manufacturing or forming method should be used over another, or that other methods for forming the lenses depicted in FIGS. 24A-24B are outside the scope of the invention. Forming "cut-outs" is only a presently preferred method for making lenses in accordance with the principles disclosed in connection with FIGS. 24A and 24B.

Figure 25A:
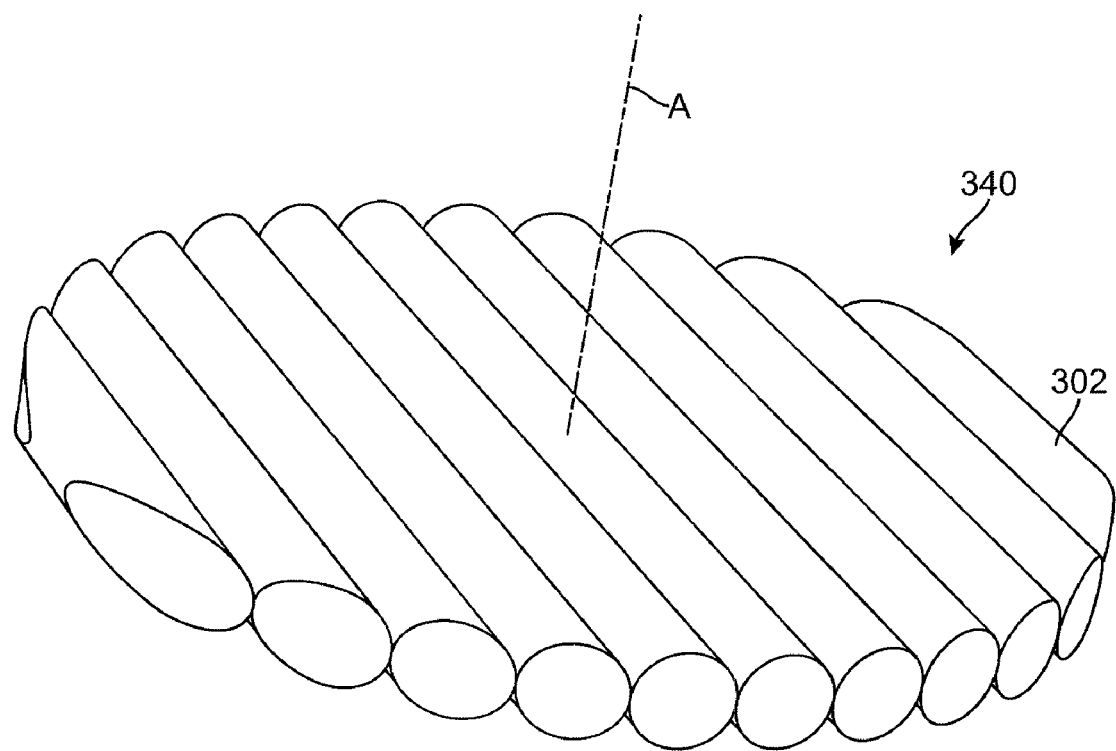
FIGS. 25A-25B depict a solar collection device, and a group of solar collection devices utilizing rod lenses and a circular perimeter. In some embodiments, the solar collection device is rotated about an axis normal to the collection plane when following the sun's apparent motion.
Figure 25B:
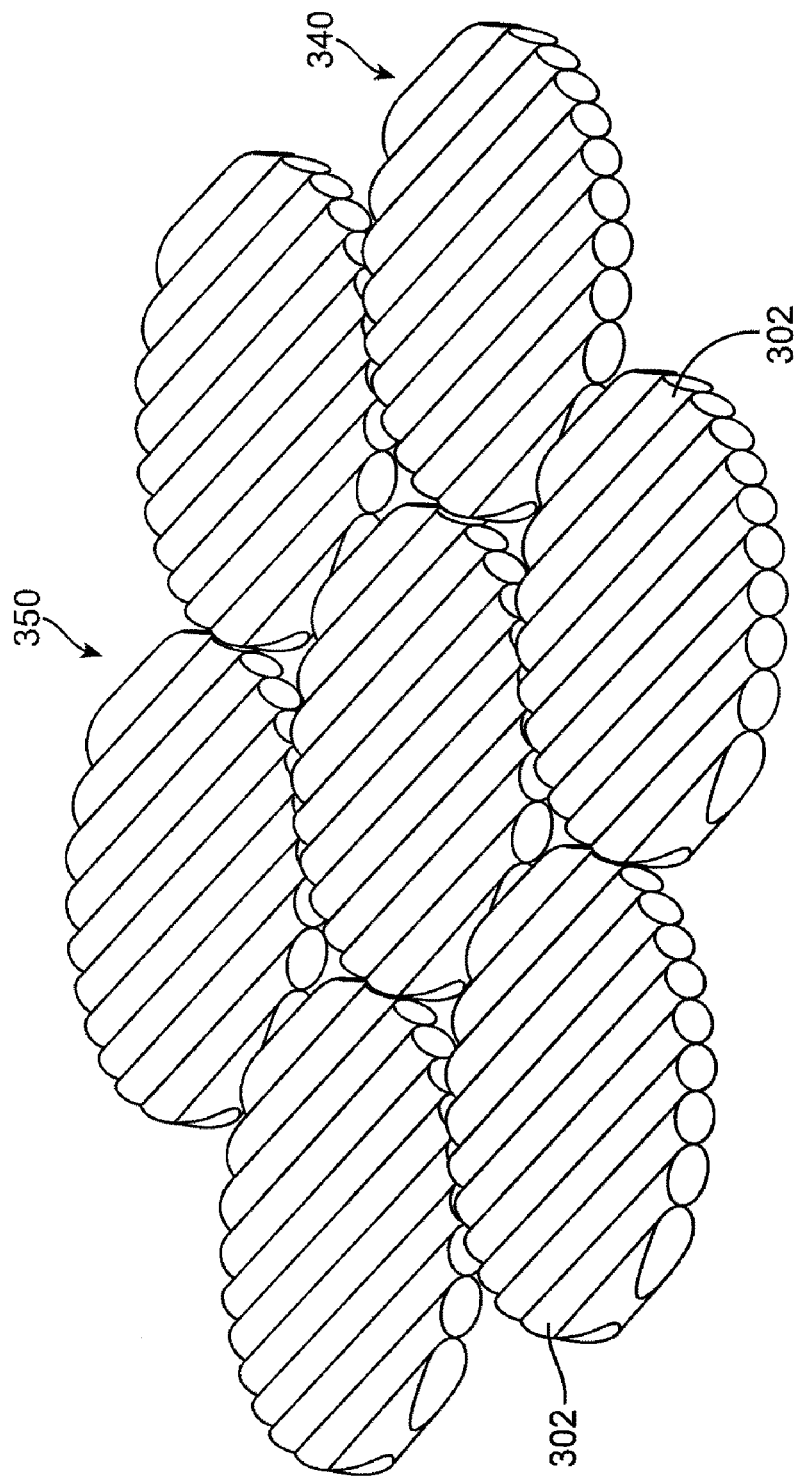

FIGS. 25A-25B depicts examples of a solar collection panel 340 having a circular perimeter formed by rod lenses 302 arranged side by side. According to this embodiment, the rod lenses may be fixed relative to each other, i.e., they do not rotate about their longitudinal axes. Instead, the panel is rotated about axis A as the sun's apparent position changes. The mechanism for rotating the panel may be located beneath the panel and coupled to a sun positioning element to rotate the panel in accordance with the sun's movement. As compared to a panel that rotates about the one or both axes perpendicular to axis A to track the sun, rotation of the panel 340 about axis A may be more easily implemented (from the perspective of the mechanism used to turn the panel, installation and locations in which the panel may be mounted). FIG. 25B depicts a solar collection array 350 made up of a collection panels 340. The panels 340 may be rotated in unison as the sun's apparent position changes by rotation of each of the panels 340 grouped together as shown.

While particular embodiments of the present invention have been shown and described, it will be obvious to those skilled in the art that changes and modifications can be made without departing from this invention in its broader aspects. Therefore, the appended claims are to encompass within their scope all such changes and modifications as fall within the true spirit and scope of this invention.

What is claimed is:

1. A solar collecting device, comprising an array of rod lenses having arranged side by side; and a photovoltaic strip disposed on each of the rod lenses, wherein the index of refraction of said array is substantially constant from a surface at which light first enters said rod lens to a surface at which light exits the rod lens and enters the said photovoltaic strip.

2. The solar collecting device of claim 1, further including a drive for rotating each of the rod lenses as the sun's apparent position changes, wherein the rotation of the rod lenses is adapted for maintaining a collection area of the photovoltaic strips facing the direction of the sun.

3. The solar collecting device of claim 2, further including disposing a cleaning strip adjacent each surface of the rod lenses for cleaning the surface of the rod lenses as the rod lenses are rotated to follow the sun.

4. The solar collecting device of claim 1, wherein the solar collecting device is devoid of an opaque lower substrate, thereby making the solar collection device essentially translucent to a nearby observer.

5. The solar collecting device of claim 4, wherein the rod lenses are suspended above a mounting surface by a support frame.

6. The solar collecting device of claim 1, wherein the solar collection device is devoid of an active cooling element.

7. The solar collecting device of claim 1, wherein the solar collection device is configured such that ambient air freely passes over opposed sides of the rod lenses to thereby cool the lenses during solar energy collection.

8. The solar collecting device of claim 1, wherein the solar collecting device is translucent and suspended from a structure by a frame.

9. The solar collecting device of claim 1, wherein a transparent cover is disposed over, below, or on both top and bottom of the rod lenses.

10. The solar collecting device of claim 1, wherein the photovoltaic material is made separately and then adhered to a rod by an adhesive with an index of refraction substantially the same as the index of refraction of the rod lens, or formed directly onto the rods in the form of a strip, via vapor deposition or other manufacturing means.

11. The solar collecting device of claim 10, wherein the photovoltaic strips are adhered to a groove formed in the rods, the groove formed by grinding a groove equal in width as the photovoltaic strip at the bottom of the rod and then placing the photovoltaic strip inside the groove such that the photovoltaic strip does not extend beyond the outer diameter of the rods.

12. The solar collecting device of claim 1, further including a frame having mounting posts for consumer installation of the device to or near a window frame, and a deployable portion that allows the rods to be selectively placed over or withdrawn from the window.

13. The solar collecting device of claim 10, wherein the device is placed within a double-pane window.

14. The solar collecting device of claim 10, wherein the device further includes one or more of a coupled motor drive, support ends configured to suspend the device from a window frame, and cleaning brushes configured to self-clean the rods.

15. The solar collecting device of claim 14, wherein the device is a dynamic device and the rotary motor drive is configured to provide rotation of the rods, while being suspended on or adjacent to a window, for following the sun's apparent path.

16. The solar collecting device of claim 15, where in the window is orientated to face substantially towards south.

17. The solar collecting device of claim 1, wherein the device is configured for being mounted on a rooftop.

18. The solar collecting device of claim 1, wherein each rod includes a portion of a pattern, message or color such that when the rods are placed in aggregate the rods together present a pattern, message or color.

19. The solar collecting device of claim 1, where in the pattern, message or color is presented to an observer during a portion of the day and in relation to the sun's apparent position in the sky.

20. The solar collecting device of claim 1, wherein the rods are circular in cross-section with cut-outs along the un-used lens portions to reduce weight and/or enhance translucency of the lens.

21. The solar collecting device of claim 20, wherein the cut-outs are arranged to create TIR and increase the concentration ratio by a factor of 2.

22. The solar collecting device of claim 21, the photovoltaic strips including a current conducting grid, wherein a reflector, a total internal reflection reflector and/or lens element is located in operative proximity to the grid so as to direct solar energy away form the grid and towards the photovoltaic material.

23. The solar collecting device of claim 1, wherein the solar collection device further includes a rotation mechanism adapted for rotating the panel about an axis normal to a collection plane.

24. The solar collecting device of claim 23, wherein the rods are fixed relative to each other and rotation about the axis maintains a photovoltaic material orientation such that focused light is received on the photovoltaic material over a range of rotation angles about the axis.

25. The solar collecting device of claim 23, wherein a perimeter of the device is circular.

26. The solar collecting device of claim 23, further including a plurality of circular-shaped solar collecting modules comprising the device, arranged to rotate in unison about an axis normal to a collection plane.

27. The solar collecting device of claim 23, wherein the mechanism is coupled to a central axis for each device and configured to apply a torque about the axis as the sun's apparent position in the sky changes, the mechanism including a sun sensing device and logic adapted for imparting a torque suitable for rotationally displacing the device so as to place the photovoltaic material in a sun-facing direction as the sun's apparent position in the sky changes.

28. The solar collecting device of claim 1, wherein the panel is a dynamic panel including a mechanism coupled to each rod and configured to apply a torque about one end of each rod as the sun's apparent position in the sky changes, the mechanism including a sun sensing device and logic adapted for imparting a torque suitable for rotationally displacing rods based on a sensed change in the sun's apparent position in the sky.

29. The solar collecting device of claim 1, further including sweepers disposed between each of the rods and configured such that as the rods turn, the sweepers clean the surface of the rods.

* * * * *